US008819509B2

(12) United States Patent
Yanagida et al.

(10) Patent No.: US 8,819,509 B2
(45) Date of Patent: Aug. 26, 2014

(54) INTEGRATED CIRCUIT, TEST CIRCUIT, AND METHOD OF TESTING

(75) Inventors: Masahiro Yanagida, Yokohama (JP); Hiroyuki Fujimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 13/600,346

(22) Filed: Aug. 31, 2012

(65) Prior Publication Data

US 2013/0111281 A1    May 2, 2013

(30) Foreign Application Priority Data

Oct. 28, 2011    (JP) .................................. 2011-237229

(51) Int. Cl.
*G01R 31/28* (2006.01)
*G11C 29/16* (2006.01)
*G11C 29/56* (2006.01)
*G11C 29/34* (2006.01)
*G11C 8/16* (2006.01)
*G11C 29/26* (2006.01)

(52) U.S. Cl.
CPC .......... *G11C 29/16* (2013.01); *G11C 29/56004* (2013.01); *G11C 29/34* (2013.01); *G11C 8/16* (2013.01); *G11C 2029/2602* (2013.01)
USPC ..................................................... 714/733

(58) Field of Classification Search
CPC .. G11C 29/16; G11C 29/56004; G11C 29/34; G11C 8/16; G11C 2029/2602; G11C 29/30; G11C 2207/104; G11C 2029/3202; G11C 29/12; G11C 29/1201; G11C 29/14; G11C 29/26; G11C 29/38; G11C 29/12015; G11C 11/41; G11C 2029/0401; G01R 31/318536
See application file for complete search history.

(56) References Cited

U.S. PATENT DOCUMENTS

| | | | |
|---|---|---|---|
| 5,812,469 A | 9/1998 | Nadeau-Dostie et al. |
| 6,779,141 B1 | 8/2004 | Pendurkar |
| 7,149,944 B2 | 12/2006 | Okawa et al. |
| 7,475,315 B1 | 1/2009 | Natarajan et al. |
| 7,724,574 B2 | 5/2010 | Kim et al. |
| 7,797,610 B1 | 9/2010 | Simkins |
| 2007/0208968 A1 | 9/2007 | Krishnamurthy et al. |

FOREIGN PATENT DOCUMENTS

| | | |
|---|---|---|
| JP | 10-040700 | 2/1998 |
| JP | 2005-235259 | 9/2005 |

OTHER PUBLICATIONS

Extended European Search Report dated Feb. 11, 2013 for corresponding European Application No. 12186333.6.

*Primary Examiner* — Guerrier Merant
(74) *Attorney, Agent, or Firm* — Fujitsu Patent Center

(57) ABSTRACT

An integrated circuit includes a storing unit; and a tester that executes a write and read test on the storing unit based on received test information including a pair of address and data, the tester including: a first retain unit that retains, when a write is made based on the test information, the first write address and the first write data used in the write; a first generator that generates, based on the first write address retained in the first retain unit, a first read address used for reading first read data from the first read address in the storing unit simultaneously with writing second write data to a second write address based on the test information; and a second generator that generates, based on the first write data retained in the first retain unit, an expected value of the first read data.

19 Claims, 16 Drawing Sheets

INTEGRATED CIRCUIT, TEST CIRCUIT, AND METHOD OF TESTING

CROSS-REFERENCE TO RELATED APPLICATION

This application is based upon and claims the benefit of priority of the prior Japanese Patent Application No. 2011-237229, filed on Oct. 28, 2011, the entire contents of which are incorporated herein by reference.

FIELD

The present disclosure relates to an integrated circuit, a test circuit, and a method of testing.

BACKGROUND

In recent large scale integrations (LSIs), a built-in self-test (BIST) circuit (hereinafter, referred to as a BIST circuit) is frequently used for testing a random access memory (RAM) integrated in an LSI, as a unit test for the LSI.

An LSI provided with BIST circuit includes a test control circuit that generates an address and data, and a control signal for testing a RAM with minimum settings supplied from the outside of the LSI. An LSI provided with a BIST circuit can automatically test a RAM using a test control circuit and the BIST circuit, and can store test results for the RAM in the BIST circuit. The pass or fail determination for the RAM can be made afterward by reading the test results stored in the BIST circuit from the outside.

As described above, by using the test control circuit and the BIST circuit in an LSI unit test, the time of the test and the number of patterns provided to the LSI can be significantly reduced, as compared to techniques wherein all of test patterns are provided to a RAM from the outside of the LSI and the results are read.

Generally, a 1 Read-Write-RAM (1RW-RAM) is used for a RAM provided in an LSI, such as a central processing unit (CPU). A 1RW-RAM uses a pair of address and data for accessing to the RAM for both read and write operations, and thus a read operation cannot be executed simultaneously with a write operation.

In recent years, in addition to a 1RW-RAM, a 1 Read-1 Write-RAM (1R1W-RAM) is provided in a CPU. A 1R1W-RAM uses two independent pairs of an address and data for accessing to the RAM for a read operation and a write operation, and hence a read operation can be executed simultaneously with a write operation.

FIG. 6 is a diagram illustrating an exemplary configuration of an integrated circuit 100 including a 1RW-RAM circuit 200 with RAM-GIST, and FIG. 7 is a diagram illustrating an exemplary configuration of an integrated circuit 110 including a 1R1 W-RAM circuit 210 with RAM-BIST.

In FIGS. 6 and 7, only address and data signals used for a test are illustrated, and control signals for a write operation and/or a read operation from a test control circuits 800 and 810 to RAMs 300 and 310, and a control signal to a result register 470b are omitted. A LSI tester for setting the test control circuits 800 and 810, and signals between the LSI tester and the test control circuits 800 and 810 are also omitted.

As illustrated in FIG. 6, the test control circuit 800 outputs a pair of address and data to the 1RW-RAM circuit 200. In the 1RW-RAM circuit 200, the address and data that are output are used, as a write address and write data for a write operation, while being used as a read address and an expected value for verifying a read data for the read operation.

In contrast, as illustrated in FIG. 7, the test control circuit 810 outputs two pairs of address and data for a write operation and a read operation to the 1R1W-RAM circuit 210. The write address and write data are used as a write address and write data for a write operation, and the read address and read data are used as a read address and a read expected value for a read operation.

In this manner, since the test control circuit 810 provides separate addresses and data for a write operation and a read operation, the integrated circuit 110 depicted in FIG. 7 can execute simultaneous read and write operation test, which is a unique operation of the 1R1W-RAM.

In FIGS. 6 and 7, when a read operation is made, data read from the 1RW-RAM 300 and 1R1W-RAM 310 is compared against an expected value in a comparator 470a, and the result of the comparison is stored in the result register 470b.

Next, the integrated circuit 100 depicted in FIG. 6 will be described in detail.

FIG. 8 is a diagram illustrating a detailed exemplary configuration of the integrated circuit 100 including the 1RW-RAM 200, and FIG. 9 is a flowchart illustrating an exemplary operation of the 1RW-RAM circuit 200.

FIG. 10 is a flowchart illustrating an exemplary operation of a march test on the test control circuit 800 for the 1RW-RAM, and FIG. 11 is a diagram illustrating an exemplary operation of the 1RW-RAM circuit 200 in the march test.

In (a) of FIG. 11, the vertical axis indicates address in a 1RW-RAM 300, whereas the horizontal axis indicates time. Further, "W0" and "W1" indicate write of 0 data and 1 data, respectively, "R0" and "R1" indicate read of 0 data and 1 data, respectively. The numbers (1) to (7) in the timing chart in (b) of FIG. 11 indicate corresponding signals or registers in FIG. 8.

An LSI generally includes multiple 1RW-RAMs, and as depicted in FIG. 8, the integrated circuit 100 includes n (n is an integer of 1 or greater) 1RW-RAM circuits 200-1 to 200-$n$, and a pattern generator (PG) 800 for the 1RW-RAMs, as an example of a test control circuit, for example. Hereinafter, any one of the 1RW-RAM circuits may be simply referred to as a 1RW-RAM circuit 200.

In the integrated circuit 100, a single PG 8 for a 1RW-RAM (hereinafter, simply referred to as a PG) 800 is connected to the multiple 1RW-RAM circuits 200, and test information is output from the PG 800 to each of the 1RW-RAM circuits 200.

The 1RW-RAM circuit 200 includes a 1RW-RAM 300 to be tested, and a BIST circuit 400A added to the 1RW-RAM 300.

Here, the 1RW-RAM 300 illustrated in FIG. 8 includes a configuration of 1024 words×72 bits, and includes a 10-bits address terminal "AD", a 1-bit write enable terminal "WE", and 72-bits data input terminal and data output terminal.

Further, a write operation and a read operation in the 1RW-RAM 300 is executed one clock after when input signals, i.e., an address signal, a write enable signal, and a data signal, are supplied from the test control circuit 800.

The 1RW-RAM 300 is a RAM which uses an input address for both a write operation and a read operation, as described above, and for an address input to the "AD" terminal, i.e., a cell selected by a signal, write is executed when a signal input to the "WE" terminal is "H", and read is executed when "L". Thus, as described above, the 1RW-RAM 300 cannot execute a write and a read simultaneously.

The PG 800 generates an "address" signal, a "data" signal, a "we" signal, and an "le" signal, and supplies them to the 1RW-RAM circuit 200 as test information.

The "address" signal is an address signal for selecting a particular cell in a particular memory cell in the 1RW-RAM 300, and the "data" signal is write data to be written to the memory cell and is also an expected value to be compared against data read from the memory cell. The "we" signal is a write enable signal for enabling the write operation, and the "le" signal is a load enable signal for controlling a comparison between read data from the 1RW-RAM 300 and the expected value.

The BIST circuit 400A includes registers 410 to 460 that store the test information supplied from the PG 800 and a data receiver (DRCV) 470.

The DRCV 470 includes a comparator 470a and a result register 470b illustrated in FIG. 6. The comparator 470a compares data read from the 1RW-RAM 300 and an expected value stored in the WD_delayed 450, and the result register 470b stores a result of the comparison by the comparator 470a.

Hereinafter, an exemplary operation of the 1RW-RAM circuit 200 will be described with reference to FIG. 9.

Firstly, test information is generated by the PG 800 and is supplied to the 1RW-RAM circuit 200, and a "we" signal is stored in a +WE 410, an "address" signal in an AD 420, a "data" signal in a WD 430, the "le" signal in a +LE 440 (Step S110).

Next, in the BIST circuit 400A, a "WD" signal which is an output from the WD 430 is stored in a WD_delayed 450, and a "+LE" signal which is an output from the +LE 440 is stored in +LE_delayed 460 (Step S120).

Also in the BIST circuit 400A, it is determined whether or not a "+WE" signal which is an output from the +WE 410 is "H", e.g., "1" (Step S130). If the "+WE" signal is "H" (the Yes route from Step S130), the "WD" signal from the WD 430 is written to the cell in the 1RW-RAM 300 selected by the data stored in the AD 420, i.e., the "AD" signal which is an output from the AD 420 (Step S140). Otherwise, if the "+WE" signal is "L", e.g., "0" (the No route from Step S130), the cell in the 1RW-RAM 300 selected by the "AD" signal from the AD 420 is read (Step S150).

Subsequently, in the BIST circuit 400A, it is determined whether or not the value of a "+en" signal which is an output from the +LE_delayed 460 is "H" (Step S160). If the "+en" signal is "H" (the Yes route from Step S160), a "Read data" signal which is read data from the 1RW-RAM 300 is compared against a "WD_delayed" signal which is an output from the WD_delayed 450, i.e., the expected value, in the DRCV 470, and the result is saved (Step S170). Otherwise, if the "+en" signal is "L" (the No route from Step S160), the processing in Step S170 is deterred.

If "+WE" signal from the +WE 410 is "H", the "+LE" signal from the +LE 440 is controlled from outside, e.g., in the PG 800, not so as to assume "H".

The processing in Step S120 is executed to synchronize the timing of the expected value supplied from the PG 800 with the timing of the "Read_data" signal from the 1RW-RAM 300, when the cell in the 1RW-RAM 300 is read in Step S150.

In other words, the WD_delayed 450 is a register that delays the "WD" signal from the WD 430 by one clock cycle required for the read operation of the 1RW-RAM 300, for the comparison by the DRCV 470 in Step S170. Similarly, the +LEdelayed 460 is a register that delays the "+LE" signal from the +LE 440 by one clock cycle, in order to wait for the result of the comparison by the DRCV 470 being stored.

In the above processing, a write or read operation can be executed on the 1RW-RAM 300, in accordance with the test information provided from the PG 800.

Next, an exemplary operation of a march test which is one functional test for a RAM in the PG 800 and the 1RW-RAM circuit 200 will be described, with reference to FIGS. 10 and 11.

Firstly, in FIG. 10, 0 data is written to all addresses in the 1RW-RAM 300 in the ascending order for initialization (Steps A1 to A4; time t10 to t11 in FIG. 11).

Specifically, test information, namely, "address=zero address", "data=L", "we=H", and "le=L" are set by the PG 800 (Step A1), and they are supplied to the 1RW-RAM 300, i.e., the 1RW-RAM circuit 200 (Step A2). Then, it is determined by the PG 800 whether or not the "address" is the last address, e.g., "1023" (Step A3). If the "address" is not the last address (the No route from Step A3), the "address" is incremented by one (Step A4), and the flow transitions to Step A2.

Otherwise, if the "address" is the last address (the Yes route from Step A3), the 0 data written during the initialization is read and 1 data is written, for all addresses in the ascending order (Steps A5 to A11; time t11 to t12 in FIG. 11).

Specifically, test information, namely, "address=zero address (0)" (Step A5), "data=L", "we=L", and "le=H" (Step A6) are set by the PG 800, and are supplied to the 1RW-RAM 300 (Step A7). Subsequently, test information, namely, "data=H", "we=H", and "le=L" are set by the PG 800 (Step A8), and are supplied to the 1RW-RAM 300 (Step A9). Then, it is determined by the PG 800 whether or not the "address" is the last address (Step A10). If the "address" is not the last address (the No route from Step A10), the "address" is incremented by one (Step A11), and the flow transitions to Step A6.

Otherwise, if the "address" is the last address (the Yes route from Step A10), the 1 data written in Steps A5 to A11 is read and 0 data is written, for all addresses in the descending order (Steps A12 to A18; time t12 to t13 in FIG. 11).

Specifically, test information, namely, "address=last address" (Step A12), "data=H", "we=L", and "le=H" (Step A13) are set by the PG 800, and are supplied to the 1RW-RAM 300 (Step A14). Subsequently, test information, namely, "data=L", "we=H", and "le=L" are set by the PG 800 (Step A15), and are supplied to the 1RW-RAM 300 (Step A16). Then, it is determined by the PG 800 whether or not the "address" is the zero address (Step A17). If the "address" is not the zero address (the No route from Step A17), the "address" is decremented by one (Step A18), and the flow transitions to Step A13.

Otherwise, if the "address" is the zero address (the Yes route from Step A17), the 0 data written in Steps A12 to A18 is read, for all addresses in the descending order (Steps A19 to A22; time t13 to t14 in FIG. 11).

Specifically, test information, namely, "address=last address", "data=L", "we=L", and "le=H" are set by the PG 800 (Step A19), and are supplied to the 1RW-RAM 300 (Step A20). Then, it is determined by the PG 800 whether or not the "address" is the zero address (Step A21). If the "address" is not the zero address (the No route from Step A21), the "address" is decremented by one (Step A22), and the flow transitions to Step A20. Otherwise, if the "address" is the zero address (the Yes route from Step A21), the processing is terminated.

In the above flow, a march test is executed wherein 0 and 1 data are written and read for the 1RW-RAM 300 in the ascending and descending orders.

Next, the integrated circuit 110 depicted in FIG. 7 will be described in detail.

FIG. 12 is a diagram illustrating a detailed exemplary configuration of an integrated circuit 110 including a 1R1W-RAM circuit 210, and FIG. 13 is a flowchart illustrating an exemplary operation of a 1R1W-RAM circuit 210.

FIGS. 14 and 15 are flowcharts illustrating an exemplary operation of a march test on the test control circuit 810 for the 1R1W-RAM, and FIG. 16 is a diagram illustrating an exemplary operation of the 1R1W-RAM circuit 210 in the march test.

In (a) of FIG. 16, the vertical axis indicates address in a 1R1W-RAM 310, whereas the horizontal axis indicates time. Further, "W0" and "W1" indicate write of 0 data and 1 data, respectively, "R0" and "R1" indicate read of 0 data and 1 data, respectively. The numbers (1) to (10) in the timing chart in (b) of FIG. 16 indicate corresponding signals or registers in FIG. 12.

As illustrated in FIG. 12, the integrated circuit 110 includes n 1R1W-RAM circuits 210-1 to 210-n, and a PG for a 1R1W-RAM as an example of a test control circuit (hereinafter, simply referred to as a PG) 810. Hereinafter, any one of the 1R1W-RAM circuits may be simply referred to as a 1R1W-RAM circuit 210.

In the integrated circuit 110, a single PG 810 is connected to the multiple 1R1W-RAM circuits 210, test information is output from the PG 810 to each of the 1R1W-RAM circuits 210.

The 1R1W-RAM circuit 210 includes a 1R1W-RAM 310 to be tested, and a BIST circuit 400B added to the 1R1W-RAM 310.

As described above, unlike the 1RW-RAM 300, the 1R1W-RAM 310 illustrated in FIG. 12 is a RAM which allows simultaneous write and read operations, and includes two address input terminals, namely, a 10-bits write address terminal "WA" and a read address terminal "RA". The 1R1W-RAM 310 further includes a 1-bit write enable terminal "WE" for controlling write operations, a read enable terminal "RE" for controlling read operations, a 72-bits data input terminal and a data output terminal.

If an input signal to the "WE" terminal is "H", the 1R1W-RAM 310 writes a cell selected by the write address, and if an input signal to the "RE" terminal is "H", the 1R1W-RAM 310 reads a cell selected by the read address. The addresses input to the "WA" and "RA" terminals are maintained to be different, for the purpose of protecting the circuit in the 1R1W-RAM 310.

Write and read operations in the 1R1W-RAM 310 are executed one clock after when input signals, i.e., a write or read address signal, a write or read enable signal, and a data signal, are supplied from the test control circuit 810.

The 1R1W-RAM 310 illustrated in FIG. 12 includes a configuration of 1024 words×72 bits, as the 1RW-RAM 300 illustrated in FIG. 8.

In a test for checking the functions of the 1R1W-RAM 310, a write and a read are simultaneously executed to check whether they are successfully executed. Therefore, two address signals, i.e., for the write and the read, two data signals, i.e., for the write and the read (expected value), and two control signals for controlling write and read operations, are required.

The PG 810 for the 1R1W-RAM 310 generates a "write address" signal, a "read address" signal, a "write data" signal, a "read data" signal, and a "we" signal, an "re" signal, and an "le" signal, as test information, and supplies them to the 1R1W-RAM circuit 210.

The "write address" and "read address" signals are write address and read address signals to select a particular memory cell in the 1R1W-RAM 310, and the "write data" signal is write data to be written to the memory cell. The "read data" signal is an expected value for comparing against data read from the memory cell, and "re" signal is a read enable signal for enabling the read operation. The "we" and "le" signals are the same as those output from the PG 800 illustrated in FIG. 8.

The BIST circuit 400B includes registers 410, 415, 420, 425, 430, 435, 440, 450, and 460 that store test information supplied from the PG 810, and a DRCV 470 similar to that illustrated in FIG. 8.

Hereinafter, an exemplary operation of the 1R1W-RAM circuit 210 will be described with reference to FIG. 13.

Firstly, test information is generated by the PG 810 and is supplied to the 1R1W-RAM circuit 210, and the "write address" signal is stored to the WA 420, the "write data" signal to the WD 430, the "we" signal to the +WE 410, the "read address" signal to the RA 425, the "read data" signal to the RD 435, the "re" signal to the +RE 415, and the "le" signal to the +LE 440 (Step S210).

Next, in the BIST circuit 400B, an "RD" signal which is an output from the RD 435 is stored in an RD_delayed 450, and a "+LE" signal which is an output from the +LE 440 is stored in +LE_delayed 460 (Step S220).

Also in the BIST circuit 400B, it is determined whether or not a "+RE" signal which is an output from the +RE 415 is "H", e.g., "1" (Step S230). If the "+RE" signal is "H" (the Yes route from Step S230), it is determined whether or not the "+WE" signal from the +WE 410 is "H" (Step S240).

If the "+WE" signal from the +WE 410 is "H" (the Yes route from Step S240), the "WD" signal from the WD 430 is written to a cell in the 1R1W-RAM 310 selected by the "WA" signal from the WA 420. Simultaneously with the write of the "WD" signal, a read is executed from a cell in the 1R1W-RAM 310 selected by the "RA" signal which is an output from the RA 425 (Step S250).

Subsequently, in the BIST circuit 400B, it is determined whether or not the value of a "+en" signal which is an output from the +LE_delayed 460 is "H" (Step S260). If the "+en" signal is "H" (the Yes route from Step S260), a "Read data" signal which is read data from the 1R1W-RAM 310 is compared against an "RD_delayed" signal which is an output from the RD_delayed 450, i.e., the expected value, in the DRCV 470, and the result is saved (Step S270). Otherwise, if the "+en" signal is "L" (the No route from Step S260), the processing in Step S270 is deterred.

Otherwise, if the "+WE" signal from the +WE 410 is "L", e.g., "0" in Step S240 (the No route from Step S240), a read is executed from a cell in the 1R1W-RAM 310 selected by the "RA" signal from the RA 425 (Step S280) and the flow proceeds to the processing in Step S260.

If "+RE" signal from the +RE 415 is "L" in Step S230 (the No route from Step S230), it is determined whether or not the "+WE" signal from the +WE 410 is "H" (Step S290). If the "+WE" signal is "H" (the Yes route from Step S290), the "WD" signal from the WD 430 is written to a cell in the 1R1W-RAM 310 selected by the "WA" signal from the WA 420 (Step S300) and the flow proceeds to the processing in Step S260. Otherwise, if the "+WE" signal is "L" (the No route from Step S290), the processing in Step S300 is deterred and the flow proceeds to the processing in Step S260.

In this case, the processing in Step S220 is executed to synchronize the timing of the expected value supplied from the PG 810 with the timing of the "Read data" from the 1R1W-RAM 310, when the cell in the 1R1W-RAM 310 is read in Step S250 or S280.

In other words, the RD_delayed 450 is a register that delays the "RD" signal from the RD 435 by one clock cycle required for the read operation of the 1R1W-RAM 310, for the comparison by the DRCV 470 in Step S270. Similarly, the +LE_delayed 460 is a register that delays the "+LE" signal from the +LE 440 by one clock cycle, in order to wait for the result of the comparison by the DRCV 470 being stored.

In the above processing, write and/or read operation(s) can be executed on the 1R1W-RAM 310, in accordance with the test information provided from the PG 810.

Next, an exemplary operation of a march test on the PG 810 and the 1R1W-RAM circuit 210 will be described with reference to FIGS. 14 to 16.

Firstly, in FIG. 14, 0 data is written to all addresses in the 1R1W-RAM 310 in the ascending order for initialization, simultaneously with read (Steps B1 to B4; time t20 to t21 in FIG. 16).

Specifically, test information, namely, "write address=zero address (0)", "write data=L", "we=H", "read address=zero address", "read data=L", "re=L", and "le=L", is set by the PG 810 (Step B1), and are supplied to the 1R1W-RAM 310, i.e., the 1R1W-RAM circuit 210 (Step B2). Then it is determined by the PG 810 whether or not the "write address" is the last address, e.g., "1023" (Step B3). If the "write address" is not the last address (the No route from Step B3), the "write address" is incremented by one and "read address=write address−1", "re=H", and "le=H" are set (Step B4) and the flow transitions to Step B2.

Thus, in Steps B1 to B4, in order to execute a read test simultaneously with a write, upon writing "write address=1 address", a read is executed from "read address=write address−1", i.e., the zero address and such a simultaneous read is repeated until the "read address" reaches the last address−1.

Otherwise, if the "address" is the last address (the Yes route from Step B3), the 0 data written during the initialization is read and 1 data is written, for all addresses in the ascending order (Steps B5 to B14; time t21 to t22 in FIG. 16).

Specifically, test information, namely, "write address=zero address", "read address=zero address", "write data=H", "re=H", and "le=H" (Step B5), and "we=L" and "read data=L" (Step B6) are set by the PG 810, and are supplied to the 1R1W-RAM 310 (Step B7). Then "we=H" is set (Step B8), and it is determined whether or not the "write address" is the zero address by the PG 810 (Step B9). If the "write address" is not the zero address (the No route from Step B9), "read data=H" and "read address=write address−1" are set (Step B10), and are supplied to the 1R1W-RAM 310 (Step B12). Otherwise, if the "write address" is the zero address (the Yes route from Step B9), "read data=L" and "read address=last address" are set (Step B11) and the flow transitions to Step B12.

Once Step B12 is executed, it is determined by the PG 810 whether or not the "write address" is the last address (Step B13). If the "write address" is not the last address (the No route from Step B13), the "write address" is incremented by one and "read address=write address" is set (Step B14) and the flow transitions to Step B6. Otherwise, if the "write address" is the last address (the Yes route from Step B13), the flow transitions to "X" in FIG. 15.

As described above, in Steps B5 to B14, for executing a simultaneous read test, a read is executed from the "read address=last address" if the "write address=zero address", otherwise, from the "read address=write address−1". Such a simultaneous read is repeated until the "read address" reaches last address−1.

Once transitioned to "X" in FIG. 15, the 1 data written in Steps B5 to B14 is read and 0 data is written, for all addresses in the descending order (Steps B15 to B24; time t22 to t23 in FIG. 16).

Specifically, test information, namely, "write address=last address", "read address=last address", "write data=L", "re=H", and "le=H" (Step B15), and "we=L" and "read data=H" (Step B16) are set by the PG 810, and are supplied to the 1R1W-RAM 310 (Step B17). Then "we=H" is set (Step B18), and it is determined whether or not the "write address" is the last address by the PG 810 (Step B19). if the "write address" is not the last address (the No route from Step B19), "read data=L" and "read address=write address+1" are set (Step B20), and are supplied to the 1R1W-RAM 310 (Step B22). Otherwise, if the "write address" is the last address (the Yes route from Step B19), "read data=H" and "read address=zero address" are set (Step B21) and the flow transitions to Step B22.

Once Step B22 is executed, it is determined by the PG 810 whether or not the "write address" is the zero address (Step B23). If the "write address" is not the zero address (the No route from Step B23), the "write address" is decremented by one and "read address=write address" is set (Step B24) and the flow transitions to Step B16.

As described above, in Steps B15 to B24, for executing a simultaneous read test, a read is executed from the "read address=zero address" if the "write address=last address", otherwise, from the "read address=write address+1". Such a simultaneous read is repeated until the "read address" reaches 1.

Otherwise, if the "address" is the zero address (the Yes route from Step B23), the 0 data written in Steps B15 to B24 is read, for all addresses in the descending order (Steps B25 to B28; time t23 to t24 in FIG. 16).

Specifically, test information, namely, "read address=last address", "read data=L", "re=H", and "le=H" are set by the PG 810 (Step B25), and are supplied to the 1R1W-RAM 310 (Step B26). Then, it is determined by the PG 810 whether or not the "read address" is the zero address (Step B27). If the "read address" is not the zero address (the No route from Step B27), the "read address" is decremented by one (Step B28), and the flow transitions to Step B26. Otherwise, if the "read address" is the zero address (the Yes route from Step B27), the processing is terminated.

A simultaneous read test is not executed in Steps B25 to B28 since no write is executed.

In the above flow, a march test is executed wherein 0 and 1 data are written and read, and a simultaneous read test is executed upon write is executed in the ascending and descending orders, for the 1R1W-RAM 310.

Note that, in a related art for generating test signals, multiple physically distinct memories include respective logic blocks, each of which receives a common input supplied from a state machine for specifically testing the memory.

In another related art, in a first operation mode, a circuit that controls write of data to a semiconductor memory, and a circuit that controls read of data from the semiconductor memory are operated on clock signals which are asynchronous from each other, whereas in a second operation mode, they are operated on clock signals which are synchronized from each other.

Patent Reference 1: Japanese Laid-Open Patent Publication No. H10-40700

Patent Reference 2: Japanese Laid-open Patent Publication No. 2005-235259

As illustrated in FIGS. 7 and 12, in order to execute a BIST on a 1R1W-RAM, two sets of address, data, and control signal supplied from a test control circuit are required.

In addition, in a functional test of a 1R1W-RAM, for executing simultaneous write and read operations, which are unique to the 1R1W-RAM, an additional function is required to a test control circuit, if the test control circuit is for a 1RW-RAM. If both 1RW-RAMs and 1R1W-RAMs are present in an integrated circuit, dedicated test control circuits are required for the respective RAMs.

Further, the signal line count distributed to each of 1R1W-RAMs in integrated circuit from test control circuit is doubled as compared to the signal line count for 1RW-RAMs, and the quantities of wires and buffers used for signal distribution are also doubled.

In addition, in the above-described related art wherein a logic block is provided to each memory, one of address bits generated for a first port is inverted in a local logic circuit to generate an address to a second port, for testing a dual port RAM. However, in this technique, expected data must be modified since an address intersection arises in the addresses for the first and second port, which results in an increase in the circuit size and the manufacturing cost of the logic circuit.

As described above, the circuit size and the manufacturing cost are increased in an integrated circuit including a 1R1W-RAM (storing unit) and a BIST circuit (tester) that tests the 1R1W-RAM, as compared to an integrated circuit including a 1RW-RAM and a BIST circuit.

SUMMARY

An integrated circuit includes a storing unit that retains data; and a tester that receives test information including a pair of address and data, and executes a write and read test on the storing unit based on the test information, the tester including: a first retain unit that retains, when first write data is written to a first write address in the storing unit based on the test information, the first write address and the first write data; a first generator that generates, based on the first write address retained in the first retain unit, a first read address used for reading first read data from the first read address in the storing unit simultaneously with writing second write data to a second write address in the storing unit based on the test information; and a second generator that generates, based on the first write data retained in the first retain unit, an expected value of the first read data that is read from the first read address in the storing unit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereunder is a description of embodiments with reference to the drawings.

(1) One Embodiment

(1-1) Exemplary Configuration of Integrated Circuit

Figure 1:
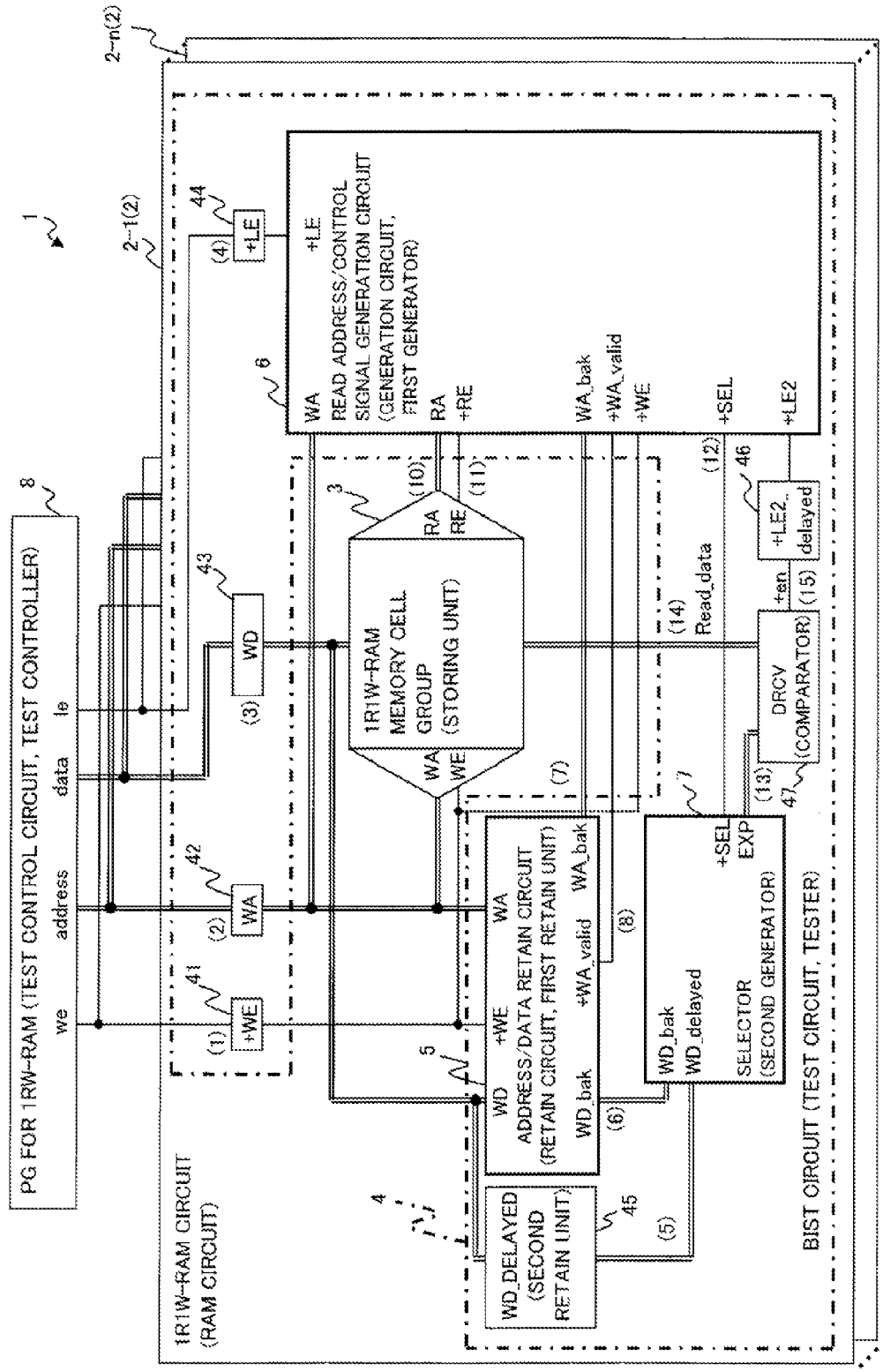
FIG. 1 is a diagram illustrating an exemplary configuration of an integrated circuit as one embodiment.
Figure 2:
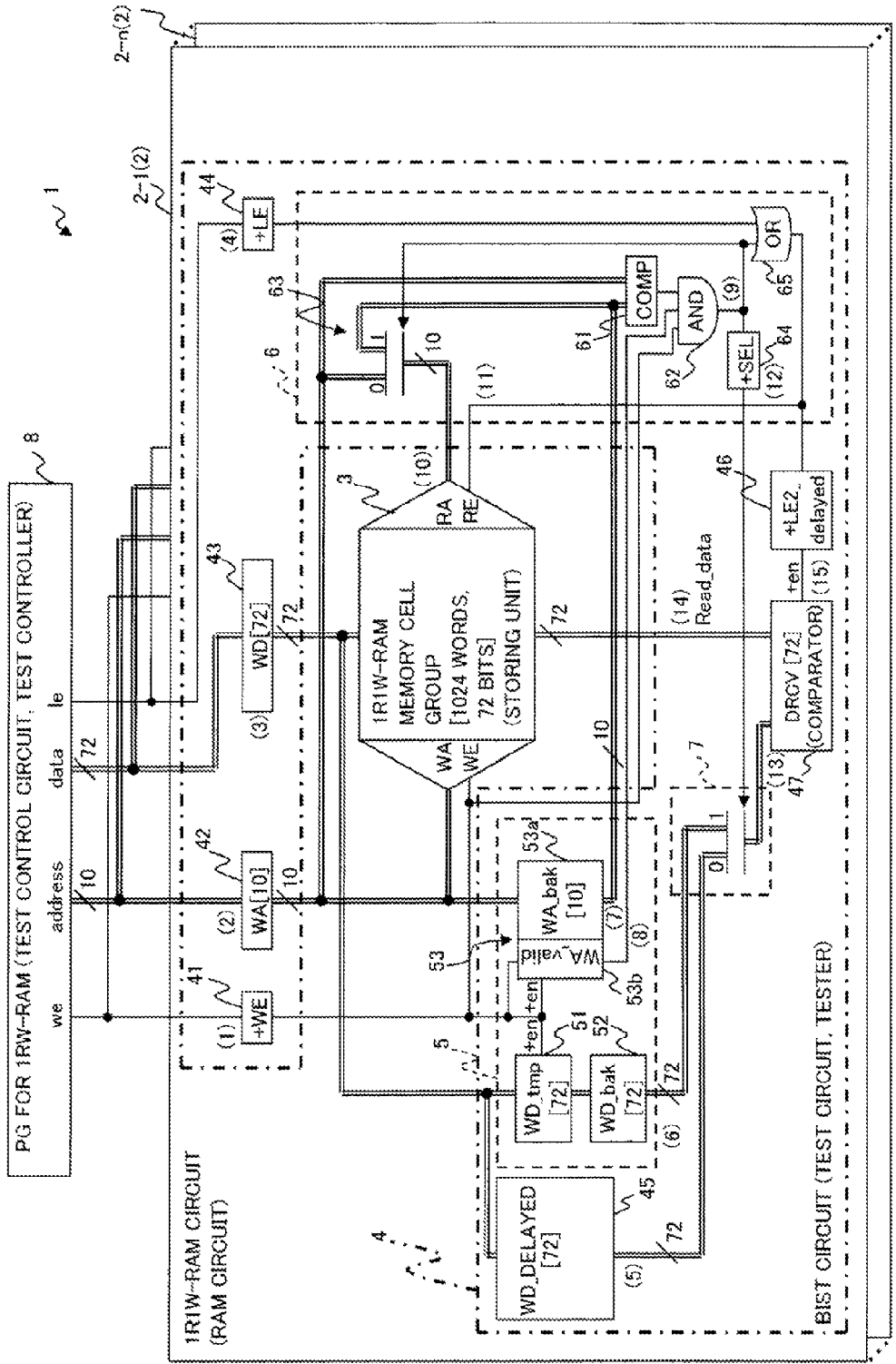
FIG. 2 is a diagram illustrating a detailed exemplary configuration of the integrated circuit in accordance with the present embodiment.

FIG. 1 is a diagram illustrating an exemplary configuration of an integrated circuit 1 as one embodiment, and FIG. 2 is a diagram illustrating a detailed exemplary configuration of the integrated circuit 1. Note that, the reference symbols in FIG. 2 that are the same as those in FIG. 1 denote the same or substantially the same elements in FIG. 1, and their detailed descriptions will be omitted.

As illustrated in FIG. 1, the integrated circuit 1 includes n RAM circuits 2-1 to 2-n, and a PG for a 1RW-RAM as an example of a test control circuit (hereinafter, simply referred to as a PG) 8. Hereinafter, any one of the RAM circuits may be simply referred to as a RAM circuit 2.

In the integrated circuit 1, a single PG 8 is connected to multiple RAM circuits 2, and test information is output from the PG 8 to each of the RAM circuits 2.

The integrated circuit 1 in accordance with the present embodiment can generate test information for a 1R1W-RAM based on test information output from the PG 8 for the 1RW-RAM, by means of a BIST circuit 4 (described later) provided in the 1R1W-RAM circuit 2, thereby executing a simultaneous read test, together with a write operation to the 1R1W-RAM 3.

Note that the integrated circuit 1 as an example of the present embodiment may includes both a 1RW-RAM circuit(s) including a 1RW-RAM (storing unit) and a 1R1W-RAM circuit including the 1R1W-RAM (storing unit) 3, in the RAM circuits 2-1 to 2-n.

Accordingly, in the integrated circuit 1, a BIST for the 1R1W-RAM 3 can be executed in a 1R1W-RAM circuit(s) 2 in each of the RAM circuits 2, using the PG 8 for a 1RW-RAM and signal wires. Thereby, a functional test of the 1R1W-RAM can be achieved without requiring additional functions in the PG 8 for a 1RW-RAM, and without increasing the number of wires within the integrated circuit 1.

Hereinafter, an exemplary operation of the 1R1W-RAM circuit 2-1 illustrated in FIG. 1 will be described. Hereinafter, unless otherwise stated, the 1R1W-RAM circuit 2-1 is simply referred to as the RAM circuit 2.

The RAM circuit 2 includes a 1R1W-RAM 3 that can store data and is to be tested, and a BIST circuit 4 provided for the 1R1W-RAM 3, as illustrated in FIG. 1.

Figure 12:
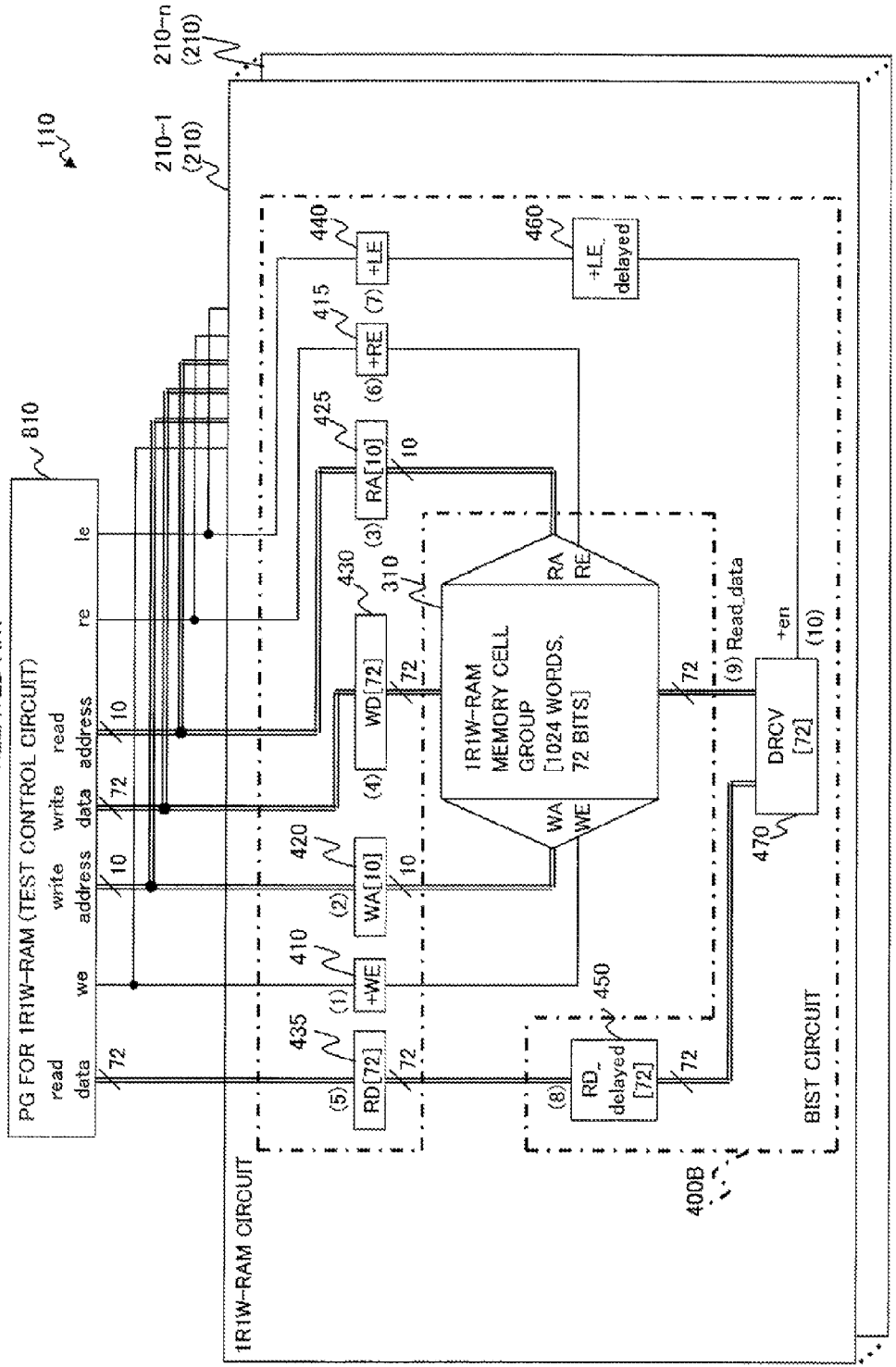
FIG. 12 is a diagram illustrating a detailed exemplary configuration of an integrated circuit including a 1R1W-RAM circuit.
Figure 13:
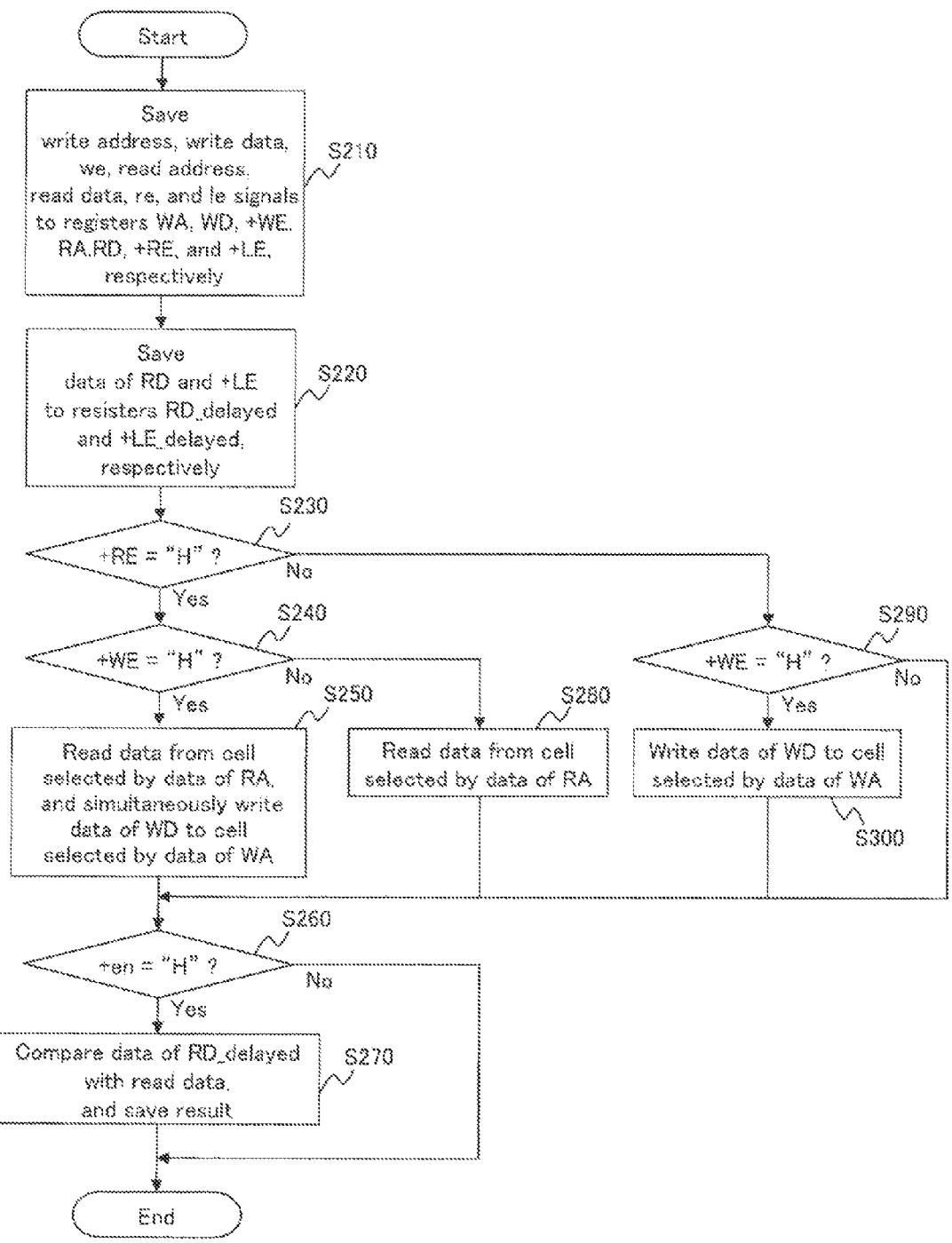
FIG. 13 is a flowchart illustrating an exemplary operation of a 1R1W-RAM circuit.
Figure 14:
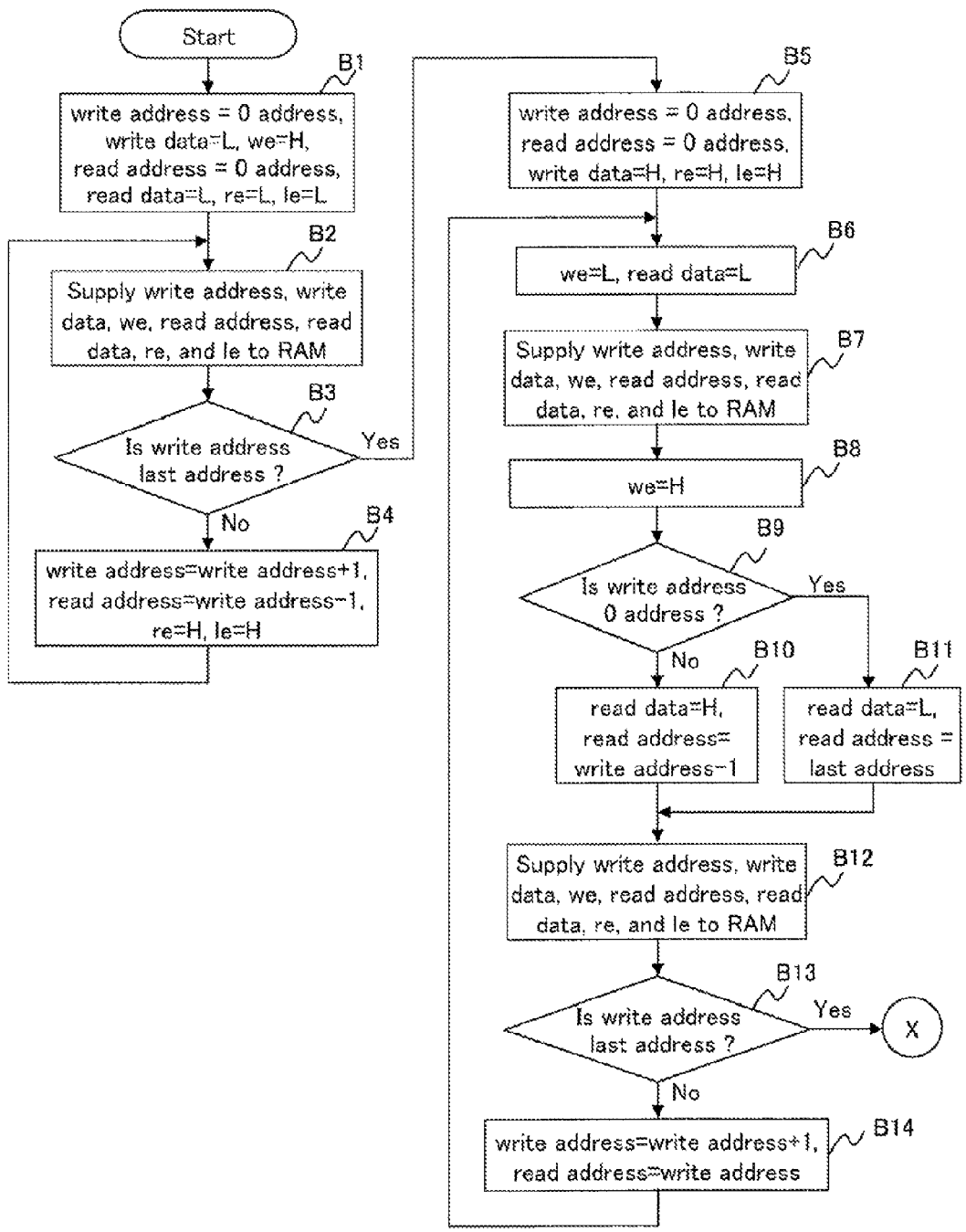
FIG. 14 is a flowchart illustrating an exemplary operation of a march test on a test control circuit for a 1R1W-RAM.
Figure 15:
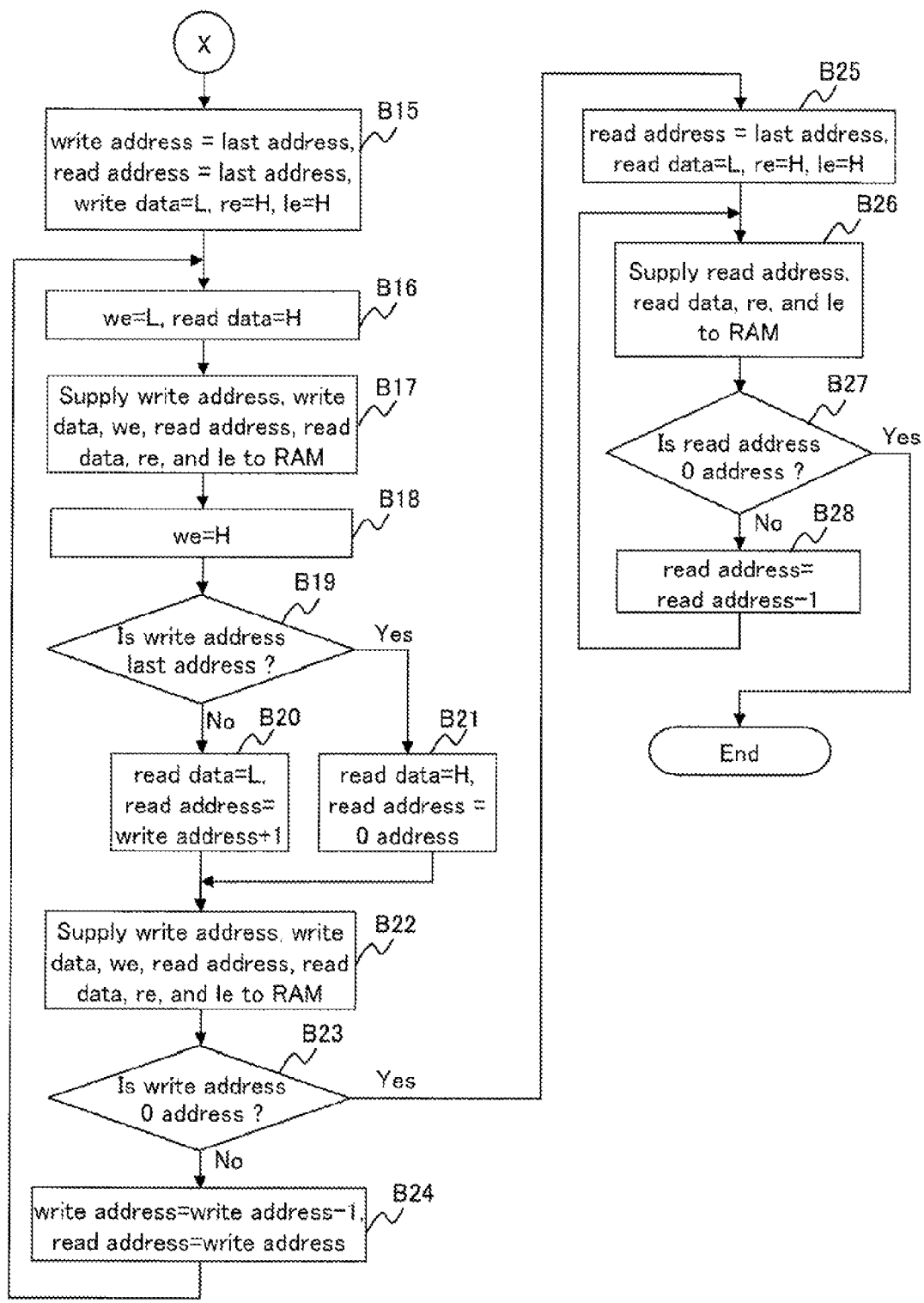
FIG. 15 is a flowchart illustrating an exemplary operation of a march test on a test control circuit for a 1R1W-RAM.

The 1R1W-RAM (first storing unit) 3 has the configuration similar to that of the 1R1W-RAM 310 illustrated in FIG. 12.

That is, the 1R1W-RAM 3 is a RAM which allows simultaneous write and read operations, and includes two address input terminals, namely, a write address terminal "WA" and a read address terminal "RA". The 1R1W-RAM 3 further includes a write enable terminal "WE" for controlling write operations, a read enable terminal "RE" for controlling read operations, a data input terminal and a data output terminal.

If an input signal to the "WE" terminal is "H", the 1R1W-RAM 3 writes a cell selected by the write address, and if an input signal to the "RE" terminal is "H", the 1R1W-RAM 3 reads a cell selected by the read address. The data read from the 1R1W-RAM 3 is input to a DRCV 47 (described later), as a "Read_data" signal that is read data (first read data).

The addresses input to the "WA" and "RA" terminals are maintained to be different, for the purpose of protecting the circuit in the 1R1W-RAM 3.

The 1R1W-RAM 3 includes a configuration of 1024 words×72 bits, and includes a 10-bits "WA" and "RA" terminals, 1-bit "WE" and "RE" terminals, and 72-bits data input and data output terminals, as depicted in FIG. 2, for example.

Write and read operations in the 1R1W-RAM 3 illustrated in FIG. 2 are executed one clock after when an "address" signal, a "data" signal, and a "we" signal (described later) are supplied. The PG 8 has the configuration similar to that of the PG 800 illustrated in FIG. 8.

That is, the PG 8 generates an "address" signal, a "data" signal, a "we" signal, and an "le" signal, and supplies them to the RAM circuit 2 as test information.

The "address" signal is a address signal for selecting a particular memory cell in the 1R1W-RAM 3, and is used as a write or read address. The "data" signal is write data to be written to a memory cell (write data), or an expected value (verification data) for comparing against data read from the memory cell. The "we" signal is a write enable signal (write control signal) for enabling a write operation, and is a signal indicating whether or not a write is to be executed to the 1R1W-RAM 3. The "le" signal is a load enable signal (comparison control signal) for controlling comparison processing, such as a comparison between the "Read_data" signal read from the 1R1W-RAM 3 and the expected value, and storage of the result of the comparison.

Note that the PG 8 transfers the 10-bits "address" signal and the 72-bits "data" signal, in parallel, to the respective 1R1W-the RAM circuits 2, as depicted in FIG. 2, for example.

A BIST circuit (test circuit, tester) 4 is supplied with test information including a pair of address and data, and execute a write and read test on the 1R1W-RAM 3, based on the test information.

The BIST circuit 4 includes registers 41 to 46 that store test information supplied from the PG 8, a DRCV 47, an address/data retain circuit 5, a read address/control signal generation circuit 6, and a selector 7.

A +WE 41 is a register that retains the "we" signal from the PG 8, a "+WE" signal output from the +WE 41 is input to the "WE" terminal in the 1R1W-RAM 3, the address/data retain circuit 5, and the read address/control signal generation circuit 6.

A WA 42 is a register that retains the "address" signal from the PG 8, a "WA" signal output from the WA 42 is input to the "WA" terminal in the 1R1W-RAM 3, the address/data retain circuit 5, and the read address/control signal generation circuit 6.

A WD 43 is a register that retains the "data" signal from the PG 8, and a "WD" signal output from the WD 43 is input to the data input terminal in the 1R1W-RAM 3, a WD_delayed 45, and the address/data retain circuit 5.

A +LE 44 is a register that retains the "le" signal from the PG 8, and a "+LE" signal output from the +LE 44 is input to the read address/control signal generation circuit 6.

The WD_delayed (second retain unit) 45 is a register that retains the "WD" signal output from the WD 43, and a "WD_delayed" signal output from the WD_delayed 45 is input to the selector 7, as a candidate for an expected value to be compared against the "Read_data" signal read from the 1R1W-RAM 3.

A +LE2_delayed 46 is a register that retains an "le2" signal (described later) generated by the read address/control signal generation circuit 6 based on a test signal from the PG 8, and a "+LE2_delayed" signal output from the +LE2_delayed 46 is input to the DRCV 47.

In this case, the WD_delayed 45 is to synchronize the timing of the expected value supplied from the PG 8 with the timing of the "Read_data" signal from the 1R1W-RAM 3, when a cell in the 1R1W-RAM 3 is read.

In other words, the RD_delayed 45 is a register that delays the "WD" signal from the WD 43 by one clock cycle required for the read operation of the 1R1W-RAM 3, for the comparison by the DRCV 47. Similarly, the +LE_delayed 46 is a register that delays the "+LE" signal from the +LE 44 by one clock cycle, in order to wait for the result of the comparison by the DRCV 47 being stored.

The DRCV (data receiver, comparator; hereinafter, also referred to as a data receiver) 47 compares the "Read_data" signal which is read data (first read data) read from a read address (first read address) in the 1R1W-RAM 3, against an expected value as verification data output from the selector 7 (described later), and stores the result of the comparison. Note that the data receiver 47 includes a comparator 47a that compares the "Read_data" signal against an expected value, and a result register 47b that stores the result of the comparison by the comparator 47a (refer to FIG. 3).

The data receiver 47 executes a comparison and storage of the result of the comparison, depending on the "+LE2_delayed" signal (control signal) output from the +LE2_delayed 46, e.g., the "+LE2_dalayed" signal being "H" indicating valid.

For example, as the BIST circuit 4 depicted in FIG. 2, the +WE 41, the +LE 44, and the +LE2_delayed 46 are 1-bit registers, the WA 42 is a 10-bits register, and the WD 43, the WD_delayed 45, and the data receiver 47 are 72-bits registers.

The address/data retain circuit (first retain unit) 5 retains a write address and write data, when the write data (first write data) is written to the write address (first write address) in the 1R1W-RAM 3, based on test information. Hereinafter, the address/data retain circuit 5 may be simply referred to as a retain circuit 5.

Note that the retain circuit 5 receives, as input signals, the "+WE" signal, the "WA" signal, and the "WD" signal, and outputs a "WA_bak" signal that is retained write address, and a "+WA_valid" signal, as output signals, to the read address/control signal generation circuit 6. The retain circuit 5 outputs a "WD_bak" signal that is retained write data, as a candidate for an expected value to be compared against the "Read_data" signal read from the 1R1W-RAM 3, to the selector 7.

The retain circuit 5 retains a write address and write data output from the WA 42 and the WD 43, and sets "H" to a flag indicating valid information, when the "+WE" signal indicates valid "H" (e.g., "1"), i.e., a write operation.

Note that the valid information is information indicating whether or not a write address supplied after a test is initiated by the BIST circuit 4 is retained, and the value set to the flag is output from the retain circuit 5, as a "+WA_valid" signal. The valid information becomes "H" once the "+WE" signal becomes "H" after the BIST is executed, i.e., a write operation is executed. For example, the valid information is initialized by setting "L", e.g., "0" indicating invalid when a BIST is executed. Once "H" is set to the valid information during a first write of write data, the valid information is kept to "H" by the retain circuit 5 until an output of a sequence of test information related to BIST from the PG 8 is completed.

Specifically, the retain circuit 5 retains, when the "+WE" signal indicates valid, the "WA" signal (second write address) that is an address and the "WD" signal (second write data) that is data supplied simultaneously with the "+WE" signal, as a "WA_bak" signal (next first write address) and a "WD_bak" signal (next first write data), which will be used upon execution of a next simultaneous read.

That is, the "WA_bak" signal is a value saving the "WA" signal supplied from the PG 8 at one step previous (immediately previous) to the current step, i.e., an address used in a write immediately previous to a write using the current write address.

Further, the "WD_bak" signal is a value saving the "WD" signal supplied from the PG 8 at one step previous to the current step, i.e., data used in a write immediately previous to a write using the current write data.

Here, a one step refers to a series of processing from the start to the end of the flowchart illustrated in FIG. 4 (described later). In other words, a single step means, for test information output from the PG 8, a write and/or read operation(s) executed on the 1R1W-RAM 3, and the processing up to Step S7 when at least the write operation is executed, and the processing up to Step S11 when only the read operation is executed.

In a BIST, test information according to the BIST test is sequentially supplied to the RAM circuit 2 from the PG 8 at every one clock, for example.

Accordingly, in the RAM circuit 2, processing, such as a shift to a register in the subsequent stage or to the 1R1W-RAM 3, or a write or read operation, or a comparison, is executed on the supplied test information, at every clock, for example.

In this manner, the retain circuit 5 retains a write address and write data used in the immediately previous write operation, and retains a valid information "WA_valid" signal indicating the validity of the retained data.

Here, the retain circuit 5 includes a WD_tmp 51, WD_bak 52, and a write address retain unit 53, as depicted in FIG. 2, for example.

The WD_tmp 51 is a 72-bits register that obtains and retains the "data" signal output from the WD 43 when the "+WE" signal output from the +WE 41 is "H", and includes a "+en" terminal that receives the "+WE" signal. A "WD_tmp" signal output from the WD_tmp 51 is input to the WD_bak 52.

The WD_bak 52 is a 72-bits register that retains the "WD_tmp" signal output from the WD_tmp 51, and the "WD_bak" signal output from the WD_bak 52 is input to the selector 7. That is, the WD_bak 52 always retains an output signal from the WD_tmp 51, and the "WD_bak" signal output from the WD_bak 52 is one clock behind the "WD_tmp" signal from the WD_tmp 51. This is to delay the "WD_bak" signal used as an expected value, by a one clock in order to synchronize the timing, since a read operation of the 1R1W-RAM 3 takes one clock, as described above.

The write address retain unit 53 is a register including a WA_bak 53*a*, a WA_valid 53*b*, and a "+en" terminal that receives the "+WE" signal.

The WA_bak 53*a* is a 10-bits register that obtains and retains the "WA" signal output from the WA 42 when the "+WE" signal output from the +WE 41 is "H", and the "WA_bak" signal output from the WA_bak 53*a* is input to the read address/control signal generation circuit 6.

The WA_valid 53*b* is a 1-bit register that obtains and retains the "+WE" signal output from the +WE 41, i.e., "H" as valid information when the "+WE" signal is "H", and the "+WA_valid" signal output from the WA_valid 53*b* is input to the read address/control signal generation circuit 6.

The read address/control signal generation circuit (first generator) 6 generates, a read address used for a write of write data (second write data) for a write address (second write address) to the 1R1W-RAM 3 based on test information, simultaneously with a read (simultaneous read) of read data from a read address (first read address) in the 1R1W-RAM 3, based on a write address (first write address) stored in the retain circuit 5. Hereinafter, the read address/control signal the generation circuit 6 is simply referred to as a generation circuit 6.

The generation circuit 6 receives the "WA_bak" signal and the "+WA_valid" signal from the retain circuit 5, the "WA" signal, the "+WE" signal, and the "+LE" signal as input signals. The generation circuit 6 outputs, as output signals, the "RA" signal that is a read address and a read enable "+RE" signal that enables a read operation, to an "RA" terminal and an "RE" terminal in the 1R1W-RAM 3, respectively. Further, the generation circuit 6 outputs, as output signals, an expected value select signal "+SEL" to the selector 7, and a load enable "+LE2" signal corresponding to a simultaneous read operation of the 1R1W-RAM 3 to the +LE2_delayed 46, respectively.

In a test for checking the functions of the 1R1W-RAM 3, a write and a read are simultaneously executed to check whether they are successfully executed. However, as described above, the PG 8 for a 1RW-RAM outputs only a single set of address, data, and control signal.

Hence, the BIST circuit 4 in accordance with the present embodiment outputs two sets of address signal, data signal, and control signal, each for simultaneous write and read, based on test information.

Specifically, the generation circuit 6 determines whether executable or not a simultaneous read that executes a write operation to the 1R1W-RAM 3 together with a read operation can be, based on the input signals and the following simultaneous read conditions, and generate information for executing the simultaneous read if it is determined that the simultaneous read can be executed. Here, the simultaneous read conditions are as follows:

("+*WA*_valid=*H*") and ("*WA*__*bak*≠*WA*") and
("+*WE*=*H*").

More specifically, the generation circuit 6 determines that a simultaneous read can be executed if both the "+WE" signal and the "+WA_valid" signal indicate valid, and if, the "WA" signal (second write address) does not match the "WA_bak" signal (first write address) stored in the retain circuit 5.

As set forth previously, since the 1R1W-RAM 3 cannot read and write simultaneously at the same address, the second condition of the simultaneous read conditions ("WA_bak≠WA") is defined.

In addition, since a simultaneous read in accordance with the present embodiment simultaneously executes a write and a read when a write is instructed in test information from the PG 8, a write is required to be instructed for executing a simultaneous read in the integrated circuit 1. Hence, the third condition of the simultaneous read conditions ("+WE=H") is defined.

The output signals output from the generation circuit 6 assume the following values, depending on whether the simultaneous read can be executed or not.

The "RA" signal becomes the "WA_bak" signal retained in the retain circuit 5 if a simultaneous read can be executed, or becomes the "WA" signal supplied from the PG 8 and retained in the WA 42 for other read operations.

In other words, the generation circuit 6 in accordance with the present embodiment generates (uses), as a read address (first read address) for executing a simultaneous read, a "WA_bak" signal, i.e., an address used for a previous write address (first write address) used in a write wherein the write address (second write address) for the current simultaneous read is used. Specifically, the generation circuit 6 supplies the "WA_bak" signal to the 1R1W-RAM 3 as an "RA" signal, when a simultaneous read is executed.

Stated differently, for enabling a simultaneous read in the RAM circuit 2, a previously write is required to be executed to the 1R1W-RAM 3. Accordingly, the first condition of the simultaneous read conditions ("+WA_valid=H") is defined.

In contrast, the generation circuit 6, if the third condition of the simultaneous read conditions ("+WE=H") is not met, generates (uses) an "RA" signal based on the "WA" signal (second write address) upon executing a normal read that is different from a simultaneous read, for example. Specifically, the generation circuit 6 supplies the "WA" signal to the 1R1W-RAM 3 as an "RA" signal, when a simultaneous read is not executed.

A "+RE" signal assumes "+RE=H" when a simultaneous read can be executed, or, a read operation is instructed from the PG 8, i.e., "+LE=H".

A "+SEL" signal (selector signal, expected value generation signal) is a signal for selecting either the "WD_bak" signal stored in the retain circuit 5 or the "WD_delayed" signal stored in the WD_delayed 45, in order to cause the selector 7 to select (generate) an expected value. A "+SEL" signal assumes different values depending on a determination as to whether a simultaneous read can be executed, and assumes "+SEL=H" indicating that the "WD_bak" signal retained in the retain circuit 5 is used as an expected value, if it is determined that a simultaneous read can be executed. In contrast, if it is determined that a simultaneous read cannot be executed, the condition "+SEL=L" is met, indicating that the "WD_delayed" signal supplied from the PG 8 and retained in the WD_delayed 45 is used as an expected value.

A "+LE2" signal is a "+LE" signal corresponding to a simultaneous read operation, and a signal for controlling a data comparator 47. The "+LE2" signal assumes "+LE2=H" when a read operation is instructed from the PG 8 (when "+LE=H"), or if a simultaneous read can be executed.

Here, the generation circuit 6 includes a comparator 61, an AND circuit 62, a selector 63, a +SEL 64, and an OR circuit 65, as depicted in FIG. 2, for example.

The comparator 61 compares the "WA_bak" signal from the retain circuit 5 and the "WA" signal, and outputs "H" to the AND circuit 62 if they do not match.

The AND circuit 62 is a three-input circuit that ANDs the output from the comparator 61, the "+WE" signal, the "+WA_valid" signal from the retain circuit 5, and sets a simultaneous read signal, that is an output signal, to "H" when the three inputs are all "H". Note that the simultaneous read signal is input to the selector 63, the +SEL 64, and the OR circuit 65.

The selector 63 receives the "WA" signal, the "WA_bak" signal from the retain circuit 5, and the simultaneous read signal, as input signals, and outputs, as the "RA" signal, the "WA_bak" signal when simultaneous read signal is "H", or the "WA" signal when the simultaneous read signal is "L". The "RA" signal is input to the "RA" terminal in the 1R1W-RAM 3, as a read address.

The OR circuit 65 is a circuit that ORs the simultaneous read signal and the "+LE" signal, and outputs an "H" output signal when at least either one of the input signals is "H". The output signal from the OR circuit 65 is input to the "RE" terminal in the 1R1W-RAM 3, as a "+RE" signal, and to the +LE2_delayed 46 as a "+LE2" signal.

The +SEL 64 is a 1-bit register that retains the simultaneous read signal that is input, and the "+SEL" signal output from the +SEL 64 is generated by delaying the simultaneous read signal by one clock and is input to the selector 7. This is to delay the "+SEL" signal used as an expected value selection signal, by a one clock in order to synchronize the timing, since a read operation of the 1R1W-RAM 3 takes one clock, as described above.

The selector (second generator) 7, if a simultaneous read can be executed, generates an expected value of read data (first read data) read from a read address (first read address) in the 1R1W-RAM 3, based on the "WD_bak" signal stored in the retain circuit 5.

Specifically, the selector 7 selects (generates) an expected value as verification data, based on a selector signal (expected value generation signal) "+SEL" output from the generation circuit 6. The selector 7 receives the "WD_bak" signal from the retain circuit 5, the "WD_delayed" signal from the WD_delayed 45, and the "+SEL" signal from the generation circuit 6, as input signals.

Depending on the selector signal "+SEL" output from the generation circuit 6, the selector 7 selects, as an expected value, the "WA_bak" signal when "+SEL=H", or the "WD_delayed" when "+SEL=L", and outputs the selected expected value to the data receiver 47 as an "EXP" signal.

Note that the functions as the selector 7 are embodied by a selector depicted in FIG. 2, for example.

As described above, the BIST circuit 4 in the integrated circuit 1 in accordance with the present embodiment, if it is determined that a simultaneous read can be executed in the generation circuit 6, supplies the received address and data to the 1R1W-RAM 3, as a write address and write data, and simultaneously supplies a read address generated by the generation circuit 6 to the 1R1W-RAM 3.

The BIST circuit 4 also compares read data read from a read address in the 1R1W-RAM 3, against an expected value selected (generated) by the selector 7.

Further, the BIST circuit 4 uses the test information "WA" signal and the "WD" signal supplied from the PG 8, as a write address and write data for executing a simultaneous read. In contrast, the BIST circuit 4 uses the "WA_bak" and "WD_bak" signals stored in the retain circuit 5, which are an write address and write data of the immediate previous write, as a write address and an expected value for executing a simultaneous read.

An address ("WA_bak" signal) and data ("WD_bak" signal) for the immediately previous write operation are used as a read address and an expected value for executing a simultaneous read, since it is assumed that any subsequent write operation is not executed and the written data is retained in the 1R1W-RAM 3 because the write is immediately previous. Accordingly, a simultaneous read can be executed in a more reliable manner.

Note that the configuration of the above-described BIST circuit 4 is that of the 1R1W-RAM circuit 2 including the 1R1W-RAM circuit 3. If the integrated circuit 1 also includes a 1RW-RAM circuit 2 including a 1RW-RAM circuit, the BIST circuit 4 provided in the 1RW-RAM circuit 2 can be replaced with the BIST circuit 400A illustrated in FIG. 8.

That is, as described above, the integrated circuit 1 includes multiple RAMs 3 including at least one 1R1W-RAM (first storing unit) 3 that can execute a write and a read, and multiple BIST circuits 4 provided for the respective multiple RAMs 3.

A BIST circuit 4 of the multiple BIST circuits 4, provided for the 1R1W-RAM 3, executes an above-described simultaneous read. Accordingly, a test, such as a BIST, can be executed on the respective RAMs by a single PG 8, even when a 1RW-RAM and a 1R1W-RAM coexist in the integrated circuit 1.

(1-2) Exemplary Configuration of Testing Apparatus

For measurements of an LSI, a measurement apparatus, known as an LSI tester, is used.

Figure 3:
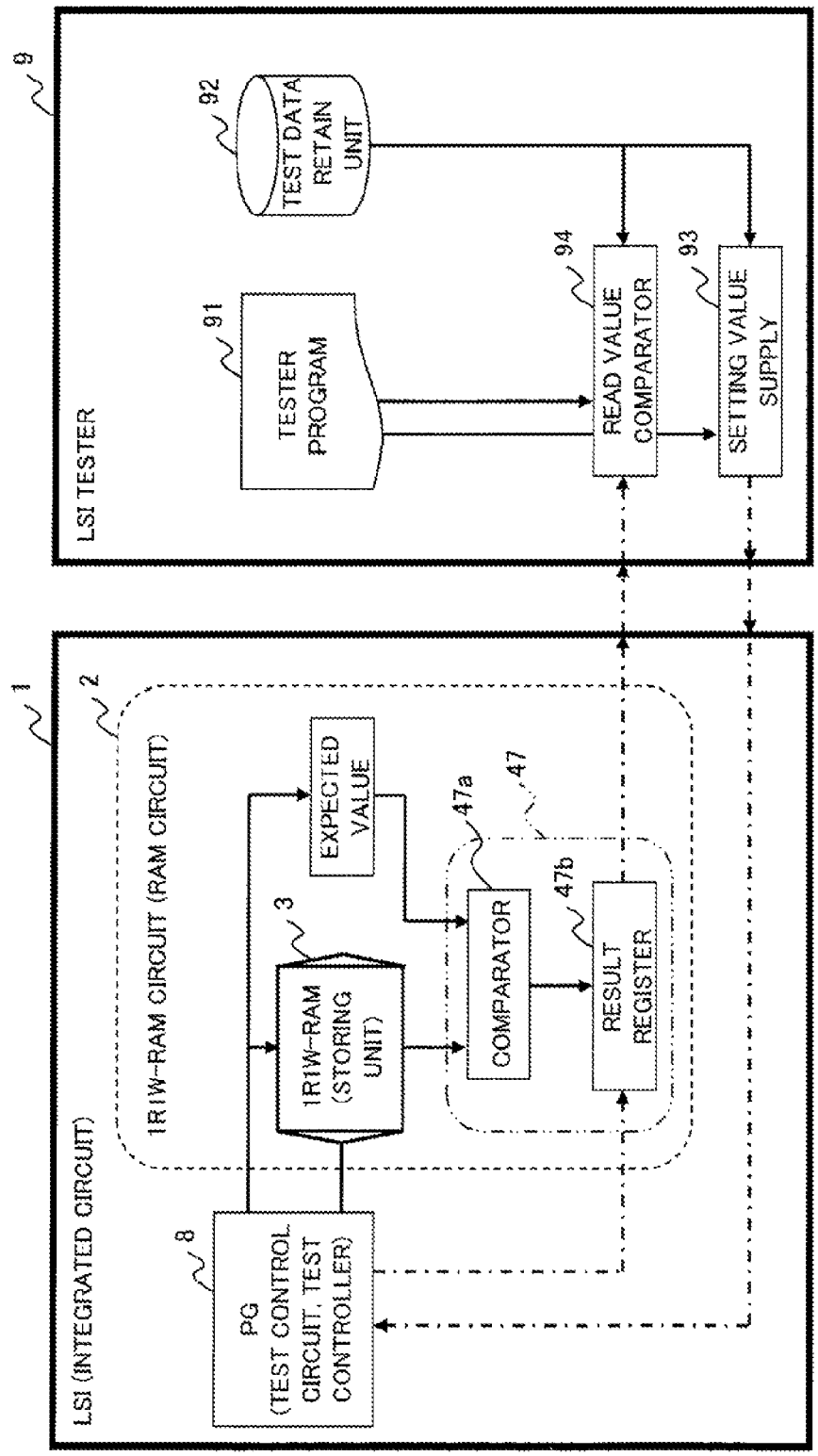
FIG. 3 is a diagram illustrating an exemplary configuration of a testing apparatus in accordance with the present embodiment.

FIG. 3 is a diagram illustrating an exemplary configuration of a testing apparatus 10 in accordance with the present embodiment.

Note that a portion of elements in the integrated circuit 1 is omitted in FIG. 3. In addition, although a power supply, clock, or other signals used in a test are supplied to the integrated circuit 1 and the LSI tester 9, their illustrations are omitted.

The testing apparatus 10 includes the above-described integrated circuit 1 depicted in FIGS. 1 and 2, and the LSI tester 9.

The LSI tester (test information supply) 9 is connected to the integrated circuit 1, and supplies a setting value (setting information) used for generating test information, to the PG 8 in the integrated circuit 1 and reads a result of the comparison, i.e., test result stored in the respective data receivers 47 in the 1R1W-RAM circuits 2.

The LSI tester 9 includes a tester program 91, a test data retain unit 92, a setting value supply 93, and a read value comparator 94.

The test data retain unit 92 retains test data for generating test information to be supplied from the PG 8 to the RAM circuit 2, and includes a storage apparatus, such as a magnetic disk, e.g., a hard disk drive (HDD), or a semiconductor drive, e.g., a solid state drive (SSD).

For example, the test data retain unit 92 retains a "data" signal in test information to be generated in the PG 8, and outputs it to the setting value supply 93 and the read value comparator 94.

The setting value supply 93 supplies a setting value to the PG 8, based on the test data from the test data retain unit 92.

The read value comparator 94 reads the result of the comparison, as the test result, stored in the respective result registers 47b in the 1R1W-the RAM circuits 2, and determines whether or not the test result matches the test data, that is the original data pattern, by comparing it against the test data from the test data retain unit 92.

The tester program 91 is stored in a storage apparatus or a read only memory (ROM), which is not illustrated, and a program for controlling an output of the setting value by the setting value supply 93 to the PG 8, or an obtainment and comparison of the test result by the read value comparator 94 from the result register 47b. Note that the LSI tester 91 includes a processor (not illustrated), such as a CPU or a micro processing unit (MPU), and the operations as the tester program 91 are embodied by processor by executing the tester program 91.

Note that the integrated circuit 1 is designed such that a measurement is made by the above-described LSI tester 9, and can set a setting value from the LSI tester 9 to PG 8, and can output the result of the comparison stored in the result register 47b.

(1-3) Exemplary Operation of Integrated Circuit

Next, an example of a BIST operation in the integrated circuit 1 in accordance with the present embodiment configured as described above will be described.

Figure 4:
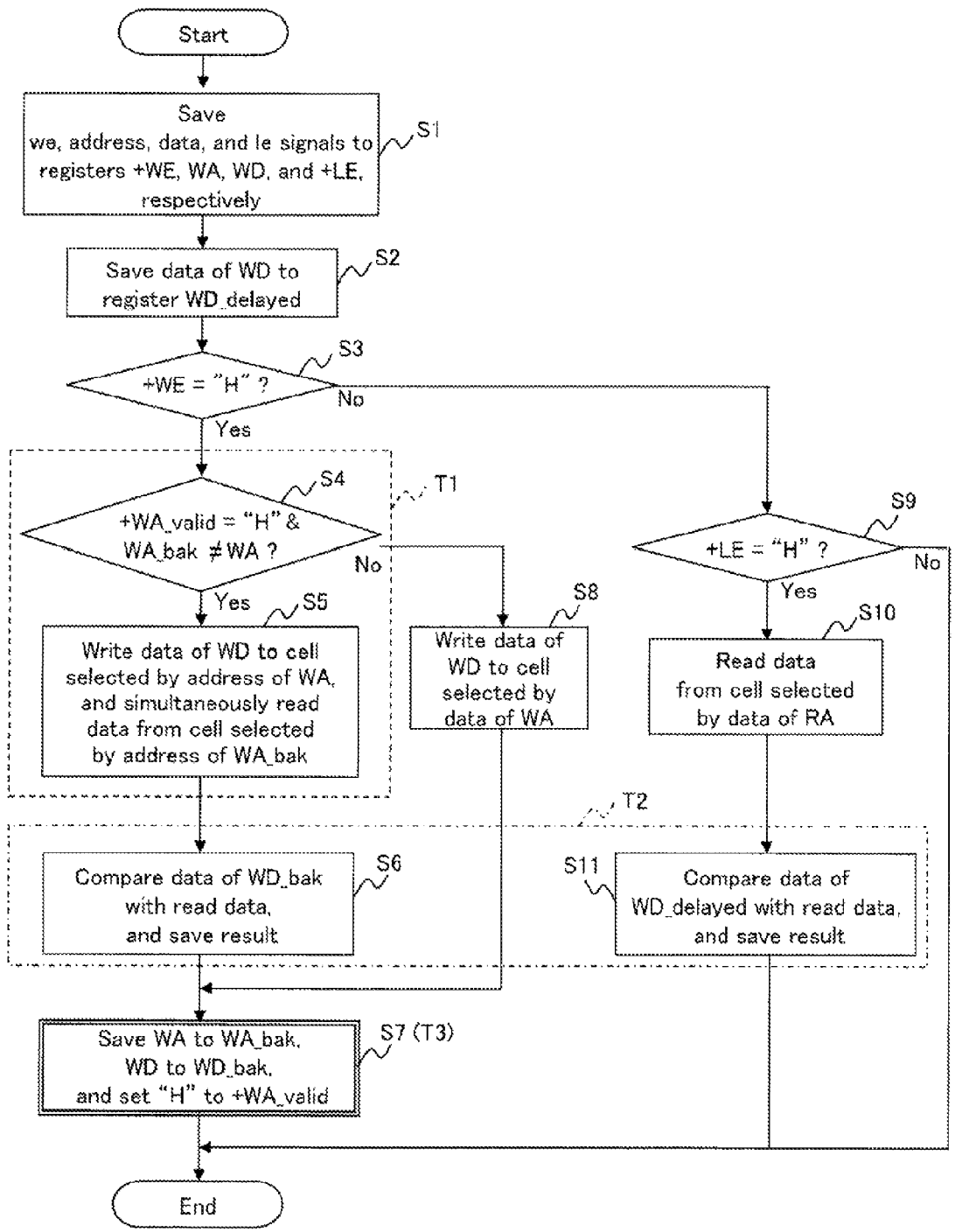
FIG. 4 is a flowchart illustrating an exemplary operation of a 1R1W-RAM circuit in accordance with the present embodiment.

FIG. 4 is a flowchart illustrating an exemplary operation of the 1R1W-RAM circuit 2 in accordance with the present embodiment.

Figure 5:
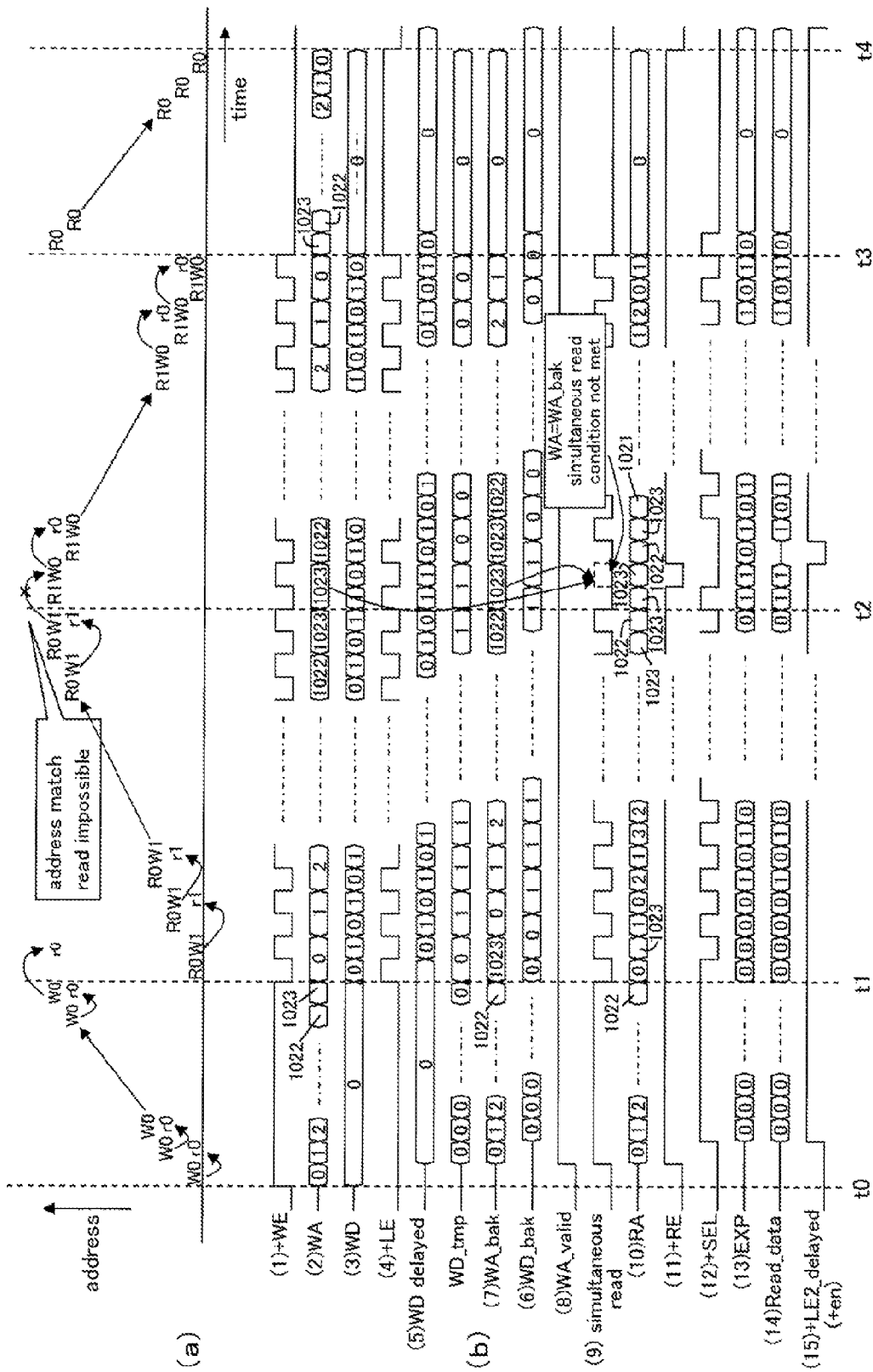
FIG. 5 is a diagram illustrating an exemplary operation of a 1R1W-RAM circuit in a march test in accordance with the present embodiment.
Figure 6:
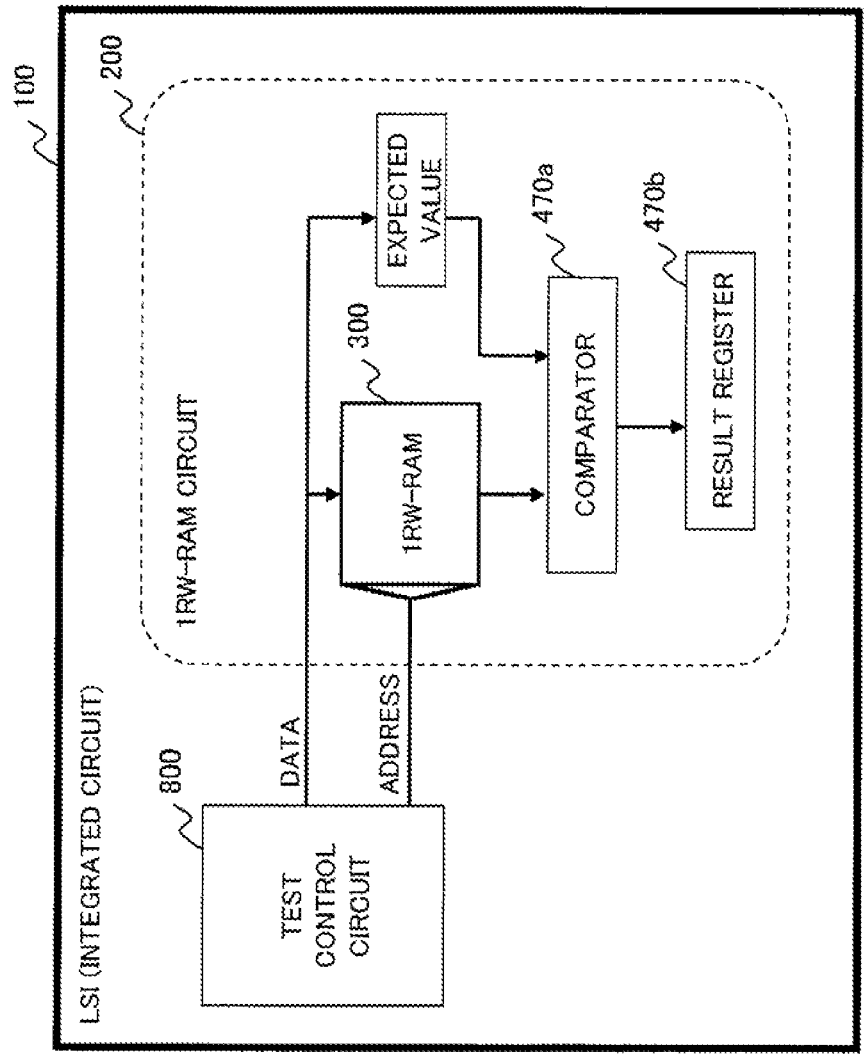
FIG. 6 is a diagram illustrating an exemplary configuration of an integrated circuit including a 1RW-RAM circuit.
Figure 7:
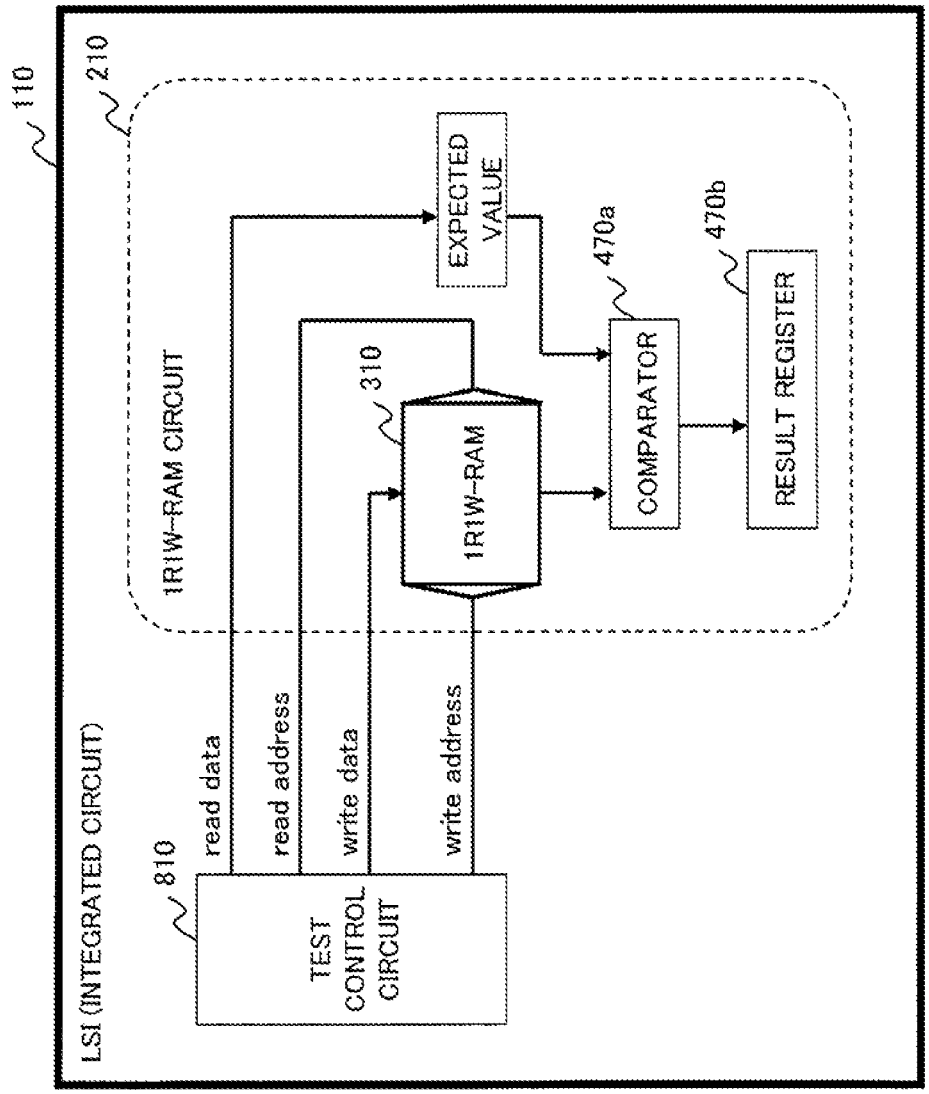
FIG. 7 is a diagram illustrating an exemplary configuration of an integrated circuit including a 1R1W-RAM circuit.

FIG. 5 is a diagram illustrating an exemplary operation of the 1R1W-RAM circuit 2 in a march test in accordance with the present embodiment. Note that (a) and (b) of FIG. 5 illustrate the operation of the 1R1W-RAM circuit 2 depicted in FIG. 4 in a march test, in a pattern sequence and timing chart when the PG 8 for a 1RW-RAM generates test information in the procedure depicted in FIG. 10.

In (a) of FIG. 5, the vertical axis indicates address in a 1R1W-RAM 3, whereas the horizontal axis indicates time. Further, "W0" and "W1" indicate write of 0 data and 1 data, respectively, "R0" and "R1" indicate read of 0 data and 1 data, respectively. The "r0" and "r1" indicate simultaneous reads of 0 data and 1 data from read addresses generated by the retain circuit 5 and the generation circuit 6, respectively.

The numbers (1) to (15) in the timing chart in (b) of FIG. 5 indicate corresponding signals or registers in FIGS. 1 and 2. In FIG. 5, the last address in the 1R1W-RAM 3 is "1023".

Hereinafter, an example of a BIST operation of the 1R1W-RAM circuit 2 will be described with reference to FIG. 4.

Firstly, test information for a BIST is generated by the PG 8 and is supplied to the 1R1W-RAM circuit 2, and a "we" signal is stored in a +WE 41, an "address" signal in an WA 42, a "data" signal in a WD 43, the "le" signal in a +LE 44 (Step S1).

Next, in the BIST circuit 4, the data in the WD 43 is stored in the WD_delayed 45 (Step S2).

In the generation circuit 6, then it is determined whether or not the "+WE" signal from the +WE register 41 is "H", e.g., "1" (Step S3; third condition of the simultaneous read conditions).

If the "+WE" signal is "H" (the Yes route from Step S3), it is determined by the generation circuit 6 whether or not the "+WA_valid" signal from the +WA Valid 53b is "H", and the "WA_bak" signal from the WA_bak 53a does not match the "WA" signal from the WA 42 (Step S4; first and second conditions of the simultaneous read conditions).

If the conditions in Step S4 are met (the Yes route from Step S4), it is determined that a simultaneous read can be executed in the generation circuit 6 and data in the "WD" signal from the WD 43 is written by the BIST circuit 4, to a cell in the 1R1W-RAM 3 selected by the address in the "WA" signal. Simultaneously, in the BIST circuit 4, the "Read_data" signal is read, as read data, from a cell in the 1R1W-RAM 3 selected by the address in the "WA_bak" signal generated by the generation circuit 6 as the "RA" signal that is the read address (Step S5).

Then, the data in the "WD_bak" signal as an expected value and the data in the "Read_data" signal read from the 1R1W-RAM 3 are compared by the data receiver 47, and the result is saved (Step S6).

Further, by the retain circuit 5, the "WA" signal is saved as a "WA_bak" signal, the "WD" signal as a "WD_bak" signal, and "H" is set as the "+WA_valid" (Step S7), and the processing is terminated. Note that the "+WA_valid" signal is maintained to "H" until the end of the BIST once "H" is set, and hence the "+WA_valid" signal may be set only in a first write in the BIST.

Otherwise, if the conditions in Step S4 are not met (the No route from Step S4), i.e., the "+WA_valid" signal is "H" or the "WA" signal matches the "WA_bak" signal, a normal write operation is executed in Step S8.

In other words, the data in the "WD" signal is written by the BIST circuit 4 to a cell in the 1R1W-RAM 3 selected by the address in the "WA" signal (Step S8). The flow then proceeds to the processing in Step S7.

If the "+WE" signal is not "H" in Step S3 (the No route from Step S3), a normal read operation is executed in Steps S9 and S10.

In other words, it is determined by the generation circuit 6 whether or not the "+LE" signal is "H" (Step S9).

If the "+LE" signal is "H" (the Yes route from Step S9), the "WA" signal generated by the generation circuit 6 as the "RA" signal that is a read address is output and the "Read_data" signal is read by the BIST circuit 4 from a cell in the 1R1W-RAM 3 selected by the address in the "RA" signal (Step S10).

Then, the data in the "WD_delayed" signal as an expected value and the data in the "Read_data" signal read from the 1R1W-RAM 3 are compared by the data receiver 47, the result is saved (Step S11), and the processing is terminated.

Otherwise, if the "+LE" signal is not "H" in Step S9 (the No route from Step S9), the processing is terminated.

In the above processing, the 1R1W-RAM circuit 2 in accordance with the present embodiment can execute write and/or read operation(s) on the 1R1W-RAM 3 in accordance with the test information provided from the PG 8.

Note that the processing in Step S3 (and S4) illustrated in FIG. 4 is processed primarily by the generation circuit 6.

In addition, in the processing in Steps S6 and S11 illustrated in FIG. 4, the selector 7 selects the "WD_bak" signal or the "WD_delayed" signal, as data used as an expected value, in accordance with the "+SEL" signal supplied from the generation circuit 6.

Further, the processing in Step S7 illustrated in FIG. 4 by the retain circuit 5 saves an address, data, and the like, used in the previous write operation, and the address, data, and the like, stored therein are used as the "WA_bak" and "WD_bak" signals, in a step executing the processing in Steps S4 to S6, in the subsequent or later clock.

Figure 8:
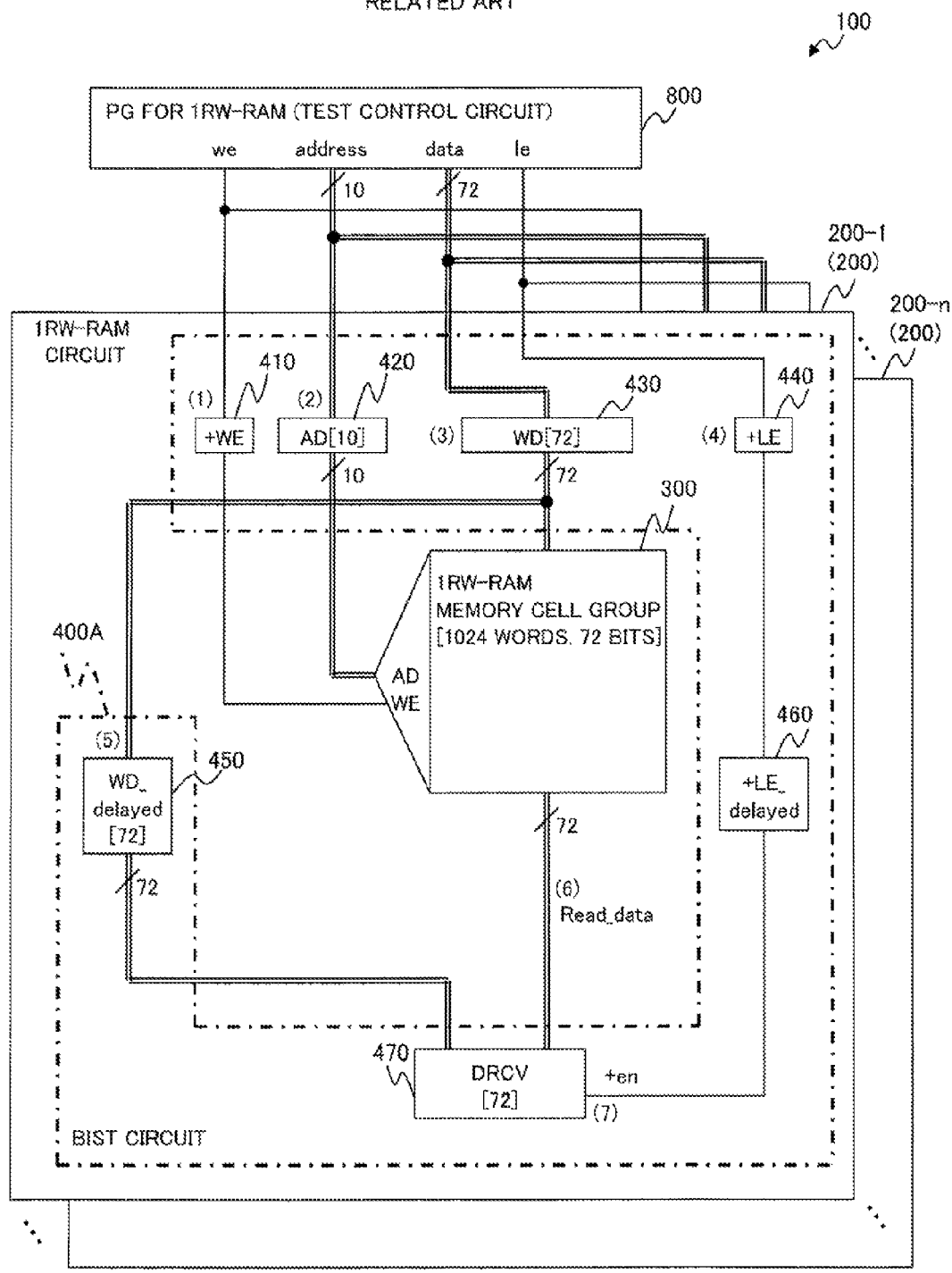
FIG. 8 is a diagram illustrating a detailed exemplary configuration of an integrated circuit including a 1RW-RAM circuit.
Figure 9:
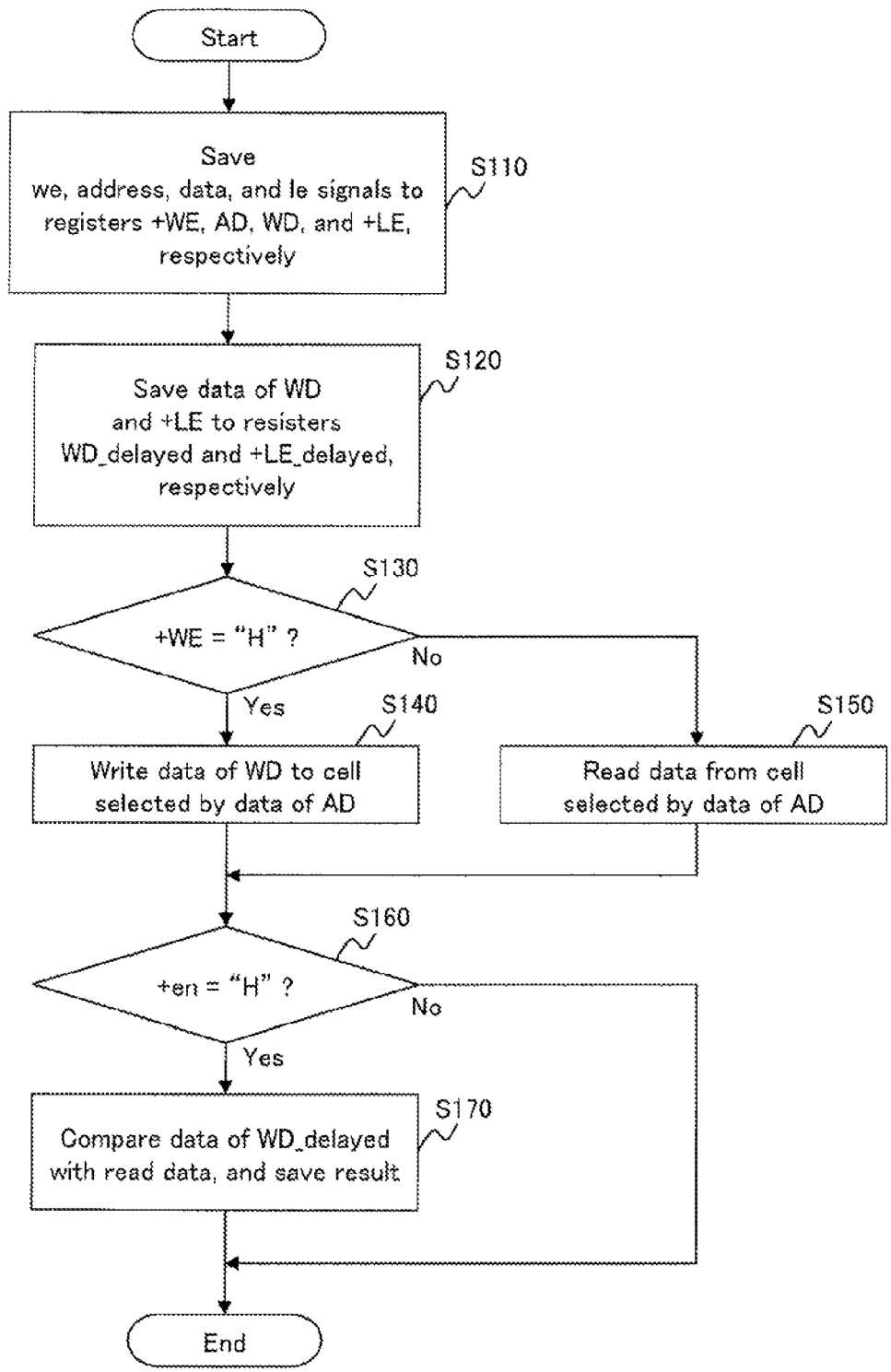
FIG. 9 is a flowchart illustrating an exemplary operation of a 1RW-RAM circuit.
Figure 10:
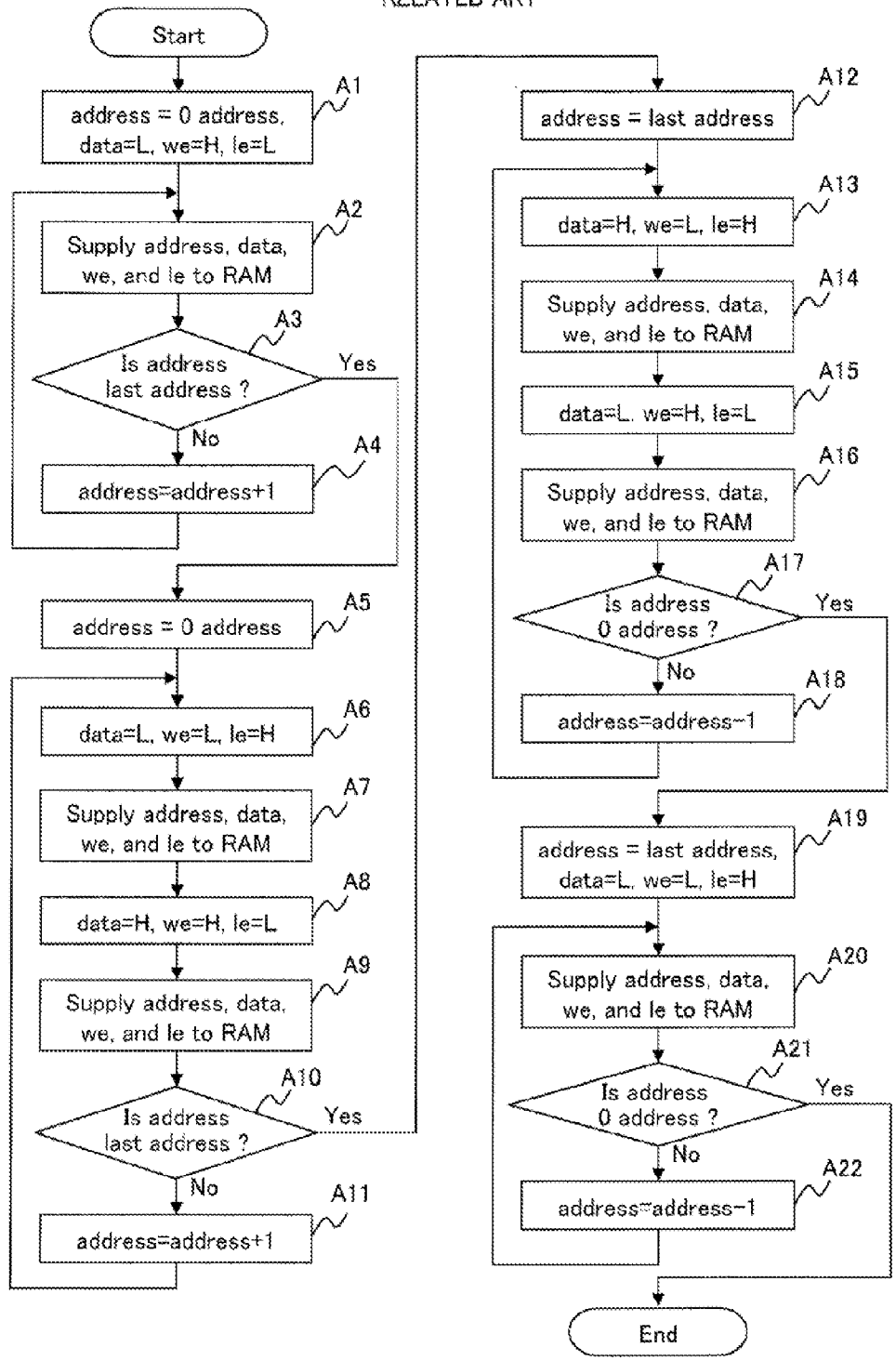
FIG. 10 is a flowchart illustrating an exemplary operation of a march test on a test control circuit for a 1RW-RAM.
Figure 11:
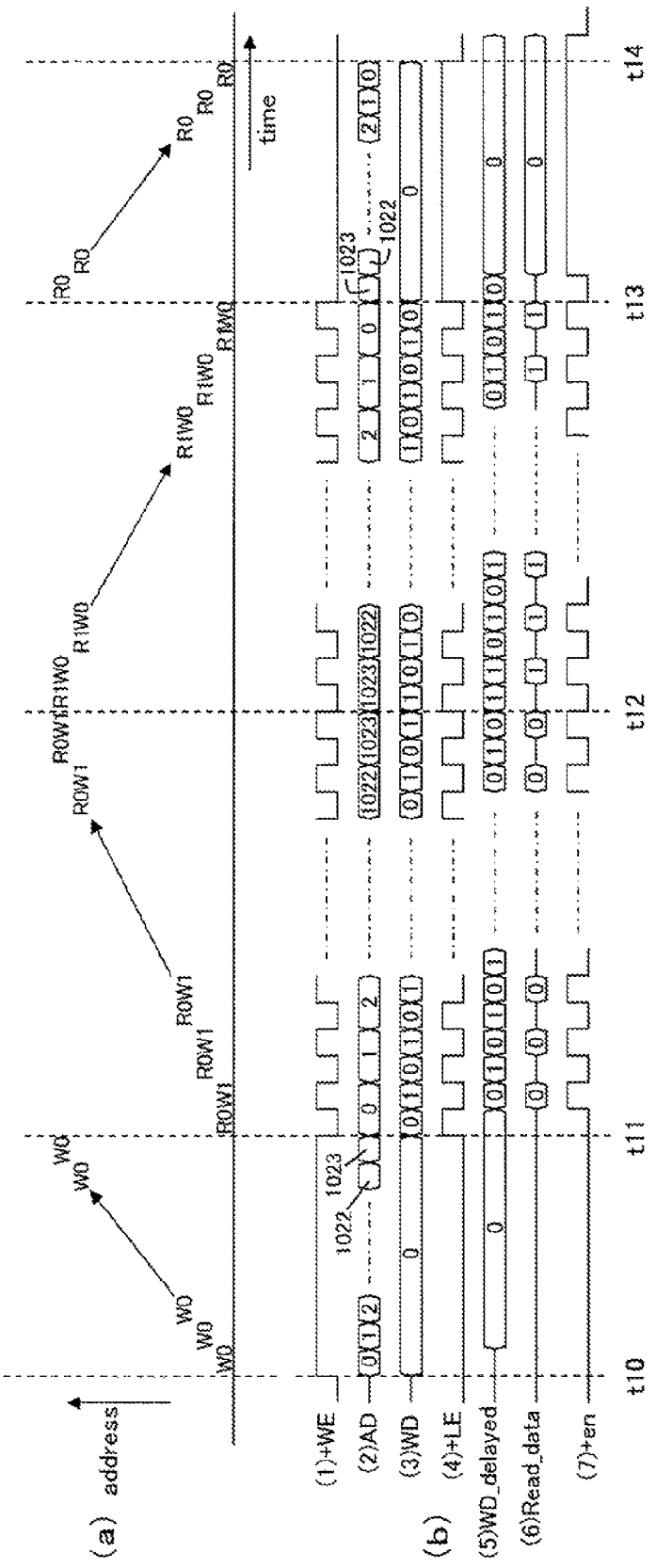
FIG. 11 is a diagram illustrating an exemplary operation of a 1RW-RAM circuit in a march test.

As described above, test information supplied from the PG 8 to the 1R1W-RAM circuit 2 is similar to test information supplied from the PG 800 depicted in FIGS. 8 and 10. However, in the integrated circuit 1 in accordance with the present embodiment, since the retain circuit 5, the generation circuit 6, and the comparator 7 are added to the 1R1W-RAM circuit 2 as additional circuits, a test of a simultaneous write and read operation can be executed.

For example, the 1R1W-RAM circuit 2 in accordance with the present embodiment can execute the operation illustrated in FIG. 5 when the PG 8 for a 1RW-RAM generates test information in the procedure depicted in FIG. 10 in a march test.

Hereinafter, exemplary operations of the PG 8 and the 1R1W-RAM circuit 2 in a march test will be described with reference to FIGS. 10 and 5, and any duplicated explanations described above will be omitted.

First, in FIG. 10, 0 data is written to all addresses in the 1R1W-RAM 3 in the ascending order for initialization (Steps A1 to A4; time t0 to t1 in FIG. 5).

Specifically, test information, namely, "address=zero address", "data=L", "we=H", and "le=L" are set by the PG 8 (Step A1), and they are supplied to the 1R1W-RAM 3, i.e., the RAM circuit 2 (Step A2). Then, it is determined by the PG 8 whether or not the "address" is the last address, e.g., "1023" (Step A3). If the "address" is not the last address (the No route from Step A3), the "address" is incremented by one (Step A4), and the flow transitions to Step A2.

Otherwise, if the "address" is the last address (the Yes route from Step A3), the 0 data written during the initialization is read and 1 data is written, for all addresses in the ascending order (Steps A5 to A11; time t1 to t2 in FIG. 5).

Specifically, test information, namely, "address=zero address (0)" (Step A5), "data=L", "we=L", and "le=H" (Step A6) are set by the PG 8, and are supplied to the 1R1W-RAM 3 (Step A7). Subsequently, test information, namely, "data=H", "we=H", and "le=L" are set by the PG 8 (Step A8), and are supplied to the 1R1W-RAM 3 (Step A9). Then, it is determined by the PG 8 whether or not the "address" is the last address (Step A10). If the "address" is not the last address (the No route from Step A10), the "address" is incremented by one (Step A11), and the flow transitions to Step A6.

Otherwise, if the "address" is the last address (the Yes route from Step A10), the 1 data written in Steps A5 to A11 is read and 0 data is written, for all addresses in the descending order (Steps A12 to A18; time t2 to t3 in FIG. 5).

Specifically, test information, namely, "address=last address" (Step A12), "data=H", "we=L", and "le=H" (Step A13) are set by the PG 8, and are supplied to the 1R1W-RAM 3 (Step A14). Subsequently, test information, namely, "data=L", "we=H", and "le=L" are set by the PG 8 (Step A15), and are supplied to the 1R1W-RAM 3 (Step A16). Then, it is determined by the PG 8 whether or not the "address" is the zero address (Step A17). If the "address" is not the zero address (the No route from Step A17), the "address" is decremented by one (Step A18), and the flow transitions to Step A13.

Otherwise, if the "address" is the zero address (the Yes route from Step A17), the 0 data written in Steps A12 to A18 is read, for all addresses in the descending order (Steps A19 to A22; time t3 to t4 in FIG. 5).

Specifically, test information, namely, "address=last address", "data=L", "we =L", and "le=H" are set by the PG 8 (Step A19), and are supplied to the 1R1W-RAM 3 (Step A20). Then, it is determined by the PG 8 whether or not the "address" is the zero address (Step A21). If the "address" is not the zero address (the No route from Step A21), the "address" is decremented by one (Step A22), and the flow transitions to Step A20. Otherwise, if the "address" is the zero address (the Yes route from Step A21), the processing is terminated.

In the above flow, a march test is executed wherein 0 and 1 data are written and read, and a simultaneous read test is executed upon write is executed in the ascending and descending orders, for the 1R1W-RAM 3.

Here, from timing t2 to the second clock in (a) and (b) of FIG. 5, the address (last address) at which a write operation is executed matches the address (last address) at which the write operation is executed at the clock immediately previous to timing t2.

That is, in a march test, in a write operation immediately after timing t2 where the "address" signal supplied from the PG 8 is switched from the ascending to descending order, the "WA_bak" signal for the immediately previous write matches the "WA" signal for a write. In such a case, in the write operation immediately after timing t2, the second condition of the simultaneous read conditions by the generation circuit 6 "WA_bak # WA" does not meet and a simultaneous read is not possible. For example, in FIG. 5, a simultaneous read of 1 data (r1) in the last address cannot be executed.

However, since a simultaneous read of 0 data (r0) from the last address together with a write operation for the last address−1 are executed from timing t2 to the fourth clock, the unavailability of a simultaneous read of 1 data (r1) from the last address is permissible as a functional test.

A testing of a simultaneous read of 1 data (r1) from the last address can be made by testing by modifying the "address" signal supplied from the PG 8 in FIG. 10, such that the sequence depicted in (a) of FIG. 5 is reversed. For testing in the reverse sequence, a simultaneous read of 1 data (r1) from the last address may be tested by testing at least at the interval from t1 to t2 in FIG. 5.

Alternatively, a test can be made by switching the value "H" and "L" of the "data" signal supplied from the PG 8 in FIG. 10. For testing by switching the value "H" and "L" of the "data" signal, a simultaneous read of 1 data (r1) from the last address may be tested by testing at least at the interval from t2 to t3 in FIG. 5.

Hence, the integrated circuit 1 in accordance with the present embodiment, circuits for generating a second set of address, data, and control signal, i.e., a retain circuit 5, a generation circuit 6, and a selector 7, are added to the BIST circuit 400A for the 1RW-RAM 300 illustrated in FIG. 8. Thereby, a BIST on the 1R1W-RAM 3 can be executed using the PG 8 (800) for the 1RW-RAM 300 and other signal wires.

Accordingly, without providing an additional function to the PG 8 for a 1RW-RAM 8 or a dedicated PG for the respective RAMs for 1RW-RAM and 1R1W-RAM, a functional test of a 1R1W-RAM 3 can be embodied, without increasing the count of wires distributed in the integrated circuit 1.

In addition, only a single set of address and data, and control signals for a write and a read is required, the numbers of wires and registers used for distributing test information to the respective RAM circuits 2 in the integrated circuit 1 can be suppressed.

Here, the number of elements required for distributing test information is estimated. Recent integrated circuits, e.g., CPUs, include one to several hundreds of RAMs integrated therein, due to increases in the cache capacity and core count. In addition, an enlarged chip size has increased the wiring distances from a PG to each RAM, and hence, several to a dozen of cycles are required to distribute signals from the PG to the RAMs.

For an integrated circuit 100 sized as illustrated in FIG. 8, the number of registers used for retaining control signals (test information) for a BIST in the 1RW-RAM circuit 200 for one cycle is:

72 bits (*WD* 430)+10 bits (*AD* 420)+1 bit (+*WE* 410)+1 bit (+*LE* 440)=84 bits.

If there are 500 1RW-RAMs 300 (n=500), and if five cycles in average are required to distribute for the 1RW-RAM 300, the number of registers required is:

84 bits (register count)×500 (units)×5 (cycles)=210,000.

Here, one half of the 500 1RW-RAMs 300 are replaced with 1R1W-RAMs 3 (310).

For the integrated circuit 110 illustrated in FIG. 12, the increase in the number of registers from the 1RW-RAMs 300 is:

72 bits (*RD* 435)+10 bits (*RA* 425)+ 1 bits (+*RE* 415)=83 bits.

If five cycles in average are required to distribute for the 1R1W-RAM 310, as in the 1RW-RAM 300, the increase in the number of registers is:

83 bits (register count)×250 (units)×5=103,750 registers.

Further, in addition to the above increase in the number of registers, the number of signals wires is also increased for additional functions to or addition of a PG.

In contrast, the integrated circuit 1 in accordance with the present embodiment, while the number of elements for signal distribution from the PG 8 to the RAM circuits 2 does not increase, the number of registers in the BIST circuit 4 increases. In the example depicted in FIG. 2, the increase is:

72 bits (*WD_tmp* 51)+72 bits (*WD_bak* 52)+10 bits (*WA_bak* 53*a*)+1 bit (*WA* valid 53*b*)+1 bit (+*SEL* 64)=156 bits.

If there are 250 1R1W-RAMs 3, 156 bits (register count)× 250 (units)=39,000.

As described above, in the integrated circuit 1 in accordance with the present embodiment, an increase in the number of elements is only 38% of the integrated circuit 110 illustrated in FIG. 12.

The increase in the number of elements in the integrated circuit 110 illustrated in FIG. 12 is proportional to the distribution cycle, and hence the advantage of the integrated circuit 1 in accordance with the present embodiment becomes more apparent if the distribution cycle increases due to the increased chip area of integrated circuits.

In addition, in the integrated circuit 1 in accordance with the present embodiment, a "WA_bak" signal is retained in the retain circuit 5, based on a set of test information that is supplied. Then, an "RA" signal used for a simultaneous read on a 1R1W-RAM 3 is generated by the generation circuit 6 based on the "WA_bak" signal stored in the retain circuit 5, and an expected value of read data read in the simultaneous read is generated by the selector 7, based on the "WD_bak" signal stored in the retain circuit 5. Accordingly, a simultaneous read can be executed based on a set of test information, and hence, an increase in the circuit size and the manufacturing cost of the integrated circuit 1 including a storing unit 3 and a tester 4 that tests the storing unit 3 can be suppressed, as described above.

In addition, since no address intersection arises and no modification to an expected value is required, the circuit size and the manufacturing cost of the logic circuit can be reduced, as compared to the above-described related art wherein a logic block is provided for each memory.

Figure 16:
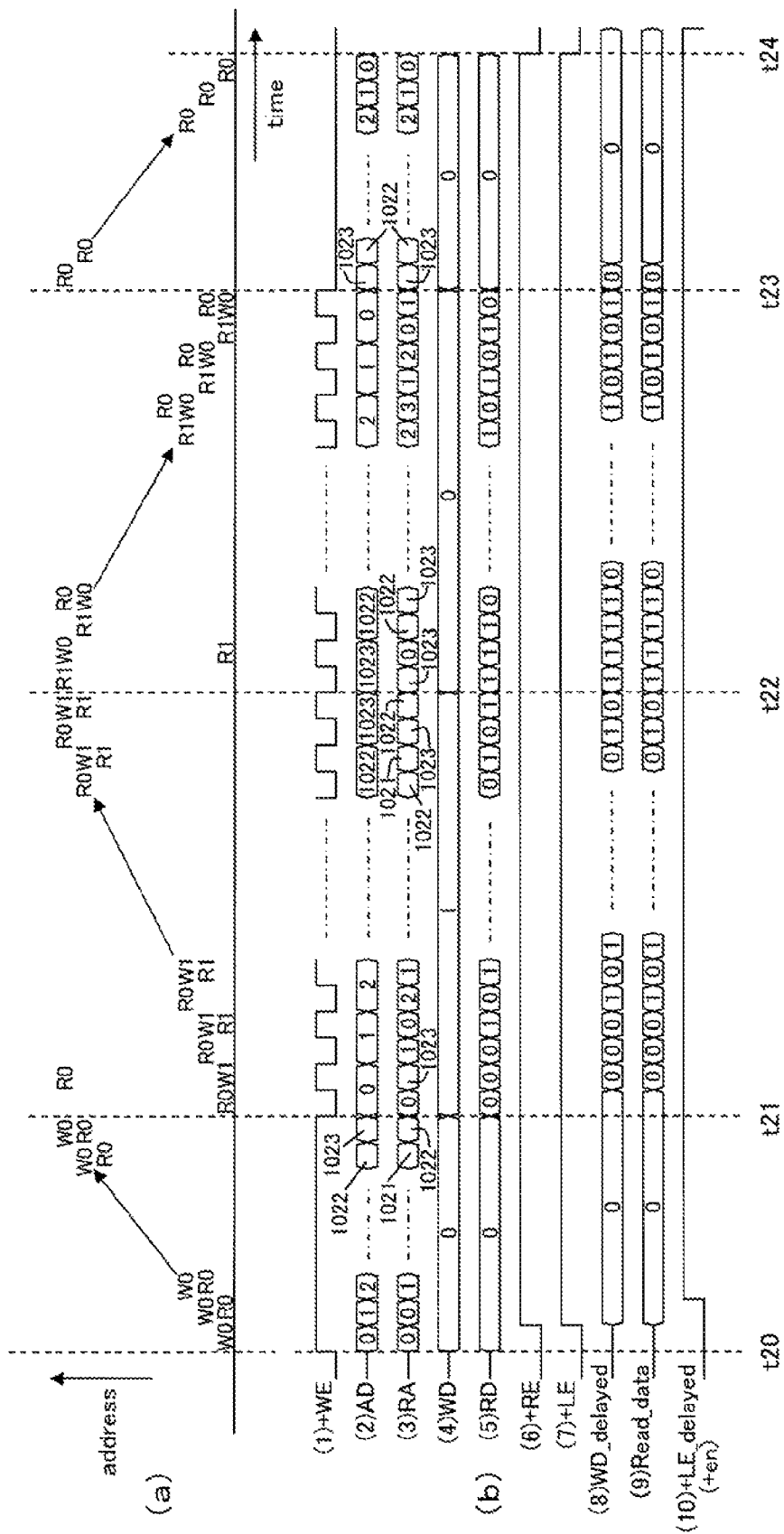
FIG. 16 is a diagram illustrating an exemplary operation of a 1R1W-RAM circuit in a march test.

Further, in the integrated circuit 1 in accordance with the present embodiment, whether or not a simultaneous read can be executed by the generation circuit 6 is determined based on the "+WE" and "+WA_valid" signals and the "WA" and "WA_bak" signals. Thereby, as depicted in FIGS. 5 and 16, a test substantially similar to a test using the PG 810 for a 1R1W-RAM can be made using the PG 8 for a 1RW-RAM. Further, write and read operations on the same address can be suppressed.

In addition, in the integrated circuit 1 in accordance with the present embodiment, either of the "WD_bak" signal and the "WD_delayed" signal can be selected by the selector 7 as an expected value, depending on a determination as to whether a simultaneous read can be executed in the generation circuit 6. In addition, the "+LE2" ("+LE2_delayed") signal controlling the comparison processing in the data receiver 47 indicates valid, if the "+LE" signal indicates valid, or if it is determined that a simultaneous read can be executed. Accordingly, a comparison of the "Read_data" signal read from the 1R1W-RAM 3 against an expected value can be handled only with a single data receiver 47. In addition, the integrated circuit 100 depicted in FIG. 8 only requires addition of a retain circuit 5, a generation circuit 6, and a selector 7, an increase in the circuit size and the manufacturing cost of the integrated circuit 1 can be suppressed.

Further, in the integrated circuit 1 in accordance with the present embodiment, only a single set of setting values for the PG 8 for a 1RW-RAM is required to be supplied from the LSI tester 9, an increase in the circuit size and the manufacturing cost for the testing apparatus 10 as a whole can be suppressed.

(2) Miscellaneous

While preferred embodiments of the present disclosure have been described in detailed above, it should be understood that these are exemplary of the invention and are not to be considered as limiting. Any modifications and variations can be made without departing from the sprit of the present disclosure.

For example, although an exemplary operation of a march test of the PG 8 and the 1R1W-RAM circuit 2 is illustrated in FIG. 5, this is not limiting and the PG 8 may supply any of other test patterns for a 1RW-RAM to the 1R1W-RAM circuit 2.

In addition, although the PG 8 has been described as being provided in the integrated circuit 1, this is not limiting and the PG 8 may be provided in the LSI tester 9, for example.

Further, the WD_delayed 45 may be provided in the retain circuit 5, the +LE2_delayed 46 may be provided in the generation circuit 6, and the selector 7 and the data receiver 47 may be integrated in a single circuit.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An integrated circuit comprising:
a storing unit that retains data; and
a tester that receives test information including a pair of address and data, and executes a write and read test on the storing unit based on the test information, the tester comprising:
a first retain unit that retains, when first write data is written to a first write address in the storing unit based on the test information, the first write address and the first write data;
a first generator that generates, based on the first write address retained in the first retain unit, a first read address used for reading first read data from the first read address in the storing unit simultaneously with writing second write data to a second write address in the storing unit based on the test information; and
a second generator that generates, based on the first write data retained in the first retain unit, an expected value of the first read data that is read from the first read address in the storing unit.

2. The integrated circuit according to claim 1, wherein
the tester supplies received address and data to the storing unit, as the second write address and the second write data, simultaneous with supplying the first read address generated by the first generator to the storing unit, and compares the first read data read from the first read address in the storing unit with the expected value generated by the second generator.

3. The integrated circuit according to claim 1, wherein
the first write address and the first write data are an address and data used in a write immediately before a write using the second write address and the second write data.

4. The integrated circuit according to claim 1, wherein
the test information further comprises a write control signal indicating whether or not a write is to be executed on the storing unit, and
the first generator determines whether or not the reading of the first read data simultaneously with the writing of the second write data can be executed based on the write control signal, generates the first read address and an expected value generation signal for causing the second generator to generate the expected value, if determining that the reading simultaneously with the writing can be executed.

5. The integrated circuit according to claim 4, wherein
the first generator determines whether or not the reading simultaneously with the writing can be executed based on the second write address and the first write address retained in the first retain unit, and generates the first read address and the expected value generation signal, if determining that the reading simultaneously with the writing can be executed.

6. The integrated circuit according to claim 5, wherein
the first retain unit retains valid information indicating whether or not a write address supplied after the tester starts a test is retained, and
the first generator determines that the reading simultaneously with the writing can be executed, if the write control signal and the valid information both indicate valid and if the second write address and the first write address retained in the first retain unit do not match.

7. The integrated circuit according to claim 4, wherein
the first generator, if determining that the reading simultaneously with the writing can be executed, outputs the first write address retained in the first retain unit to the tester, as the first read address, and outputs the expected value generation signal to the second generator, and the second generator outputs the first write data retained in the first retain unit to the tester as the expected value, depending on the expected value generation signal.

8. The integrated circuit according to claim 7, wherein the first retain unit, if the write control signal indicates valid, retains address and data supplied simultaneously with the write control signal, as a first write address and first write data used for executing a next reading simultaneously with the writing.

9. The integrated circuit according to claim 7, wherein the tester further comprises a second retain unit that retains the second write data, and the second generator, if the first generator determines that the reading simultaneously with the writing cannot be executed, generates an expected value used for the comparison with the first read data read from the first read address in the storing unit, based on the second write data retained in the second retain unit.

10. The integrated circuits according to claim 9, wherein the first generator selects one of the first write data retained in the first retain unit and the second write data retained in the second retain unit to generate the expected value generation signal, based on the determination whether or not the reading simultaneously with the writing can be executed, and the second generator functions as a selector that selects the expected value, depending on the expected value generation signal.

11. The integrated circuit according to claim 10, wherein the tester further comprises a comparator that compares the first read data read from the first read address in the storing unit, with the expected value selected by the second generator.

12. The integrated circuit according to claim 11, wherein the test information further comprises a comparison control signal that controls the comparison of the first read data from the storing unit and the expected value by the comparator, the first generator, if the comparison control signal indicates valid, or if the first generator determines that the reading simultaneously with the writing can be executed, generates a control signal for controlling the comparator as valid, and the comparator compares, if the control signal indicates valid, the first read data with the expected value.

13. The integrated circuit according to claim 12, wherein the first generator generates, if determining that the reading simultaneously with the writing cannot be executed, the first read address based on the second write address.

14. The integrated circuit according to claim 1, further comprising
a test controller that supplies the test information to the tester.

15. The integrated circuit according to claim 1, further comprising:
a plurality of storing units, each comprising at least one first storing unit that can simultaneously execute a write and a read; and
a plurality of testers, each provided for each of the plurality of storing units,
wherein the tester provided for the first storing unit of the plurality of testers executes the reading simultaneously with the writing.

16. A test circuit that receives test information including a pair of address and data, and executes a write and read test on a storing unit that retains data, based on the test information, the test circuit comprising:
a first retain unit that retains, when first write data is written to a first write address in the storing unit based on the test information, the first write address and the first write data;
a first generator that generates, based on the first write address retained in the first retain unit, a first read address used for reading first read data from the first read address in the storing unit simultaneously with writing second write data to a second write address in the storing unit based on the test information; and
a second generator that generates, based on the first write data retained in the first retain unit, an expected value of the first read data that is read from the first read address in the storing unit.

17. A method of testing in an integrated circuit comprising a storing unit that retains data; and a tester that receives test information including a pair of address and data, and executes a write and read test on the storing unit based on the test information, the method comprising, by the tester:
retaining, when first write data is written to a first write address to the storing unit based on the test information, the first write address and the first write data;
generating, based on the first write address retained in the first retain unit, a first read address used for reading first read data from the first read address in the storing unit simultaneously with writing second write data to a second write address in the storing unit based on the test information; and
generating, based on the first write data retained in the first retain unit, an expected value of the first read data that is read from the first read address in the storing unit.

18. The method according to claim 17, further comprising, by the tester:
supplying received address and data to the storing unit, as the second write address and the second write data, simultaneous with supplying the first read address generated by the first generator to the storing unit, and
comparing the first read data read from the first read address in the storing unit with the generated expected value.

19. The method according to claim 17, wherein the first write address and the first write data are an address and data used in a write immediately before a write using the second write address and second write data.

* * * * *